US011825709B2

(12) United States Patent
Kim et al.

(10) Patent No.: US 11,825,709 B2
(45) Date of Patent: Nov. 21, 2023

(54) DISPLAY DEVICE

(71) Applicant: Samsung Display Co., Ltd., Yongin-si (KR)

(72) Inventors: Sukyoung Kim, Yongin-si (KR); Yujin Jeon, Yongin-si (KR); Wonkyu Kwak, Yongin-si (KR); Changsoo Pyon, Yongin-si (KR); Wonse Lee, Yongin-si (KR); Donghyeon Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 87 days.

(21) Appl. No.: 17/229,879

(22) Filed: Apr. 14, 2021

(65) Prior Publication Data
US 2022/0052142 A1 Feb. 17, 2022

(30) Foreign Application Priority Data
Aug. 11, 2020 (KR) ........................ 10-2020-0100750

(51) Int. Cl.
| | |
|---|---|
| *H10K 59/121* | (2023.01) |
| *H10K 50/844* | (2023.01) |
| *H10K 59/65* | (2023.01) |
| *G09F 9/30* | (2006.01) |
| *H01L 27/32* | (2006.01) |
| *H10K 59/131* | (2023.01) |
| *H10K 50/842* | (2023.01) |
| *H10K 59/122* | (2023.01) |
| *H10K 59/124* | (2023.01) |

(Continued)

(52) U.S. Cl.
CPC ....... *H10K 59/131* (2023.02); *H10K 50/8426* (2023.02); *H10K 59/122* (2023.02); *H10K 59/124* (2023.02); *H10K 77/111* (2023.02); *H10K 2102/311* (2023.02)

(58) Field of Classification Search
CPC ... H01L 27/3246–3276; H01L 51/0097; H01L 51/5246; H01L 51/5338
See application file for complete search history.

(56) References Cited

U.S. PATENT DOCUMENTS

| | | | |
|---|---|---|---|
| 10,049,618 | B2 | 8/2018 | Jeong |
| 11,226,528 | B2 | 1/2022 | Ouyang et al. |

(Continued)

FOREIGN PATENT DOCUMENTS

| | | | | | |
|---|---|---|---|---|---|
| CN | 1937024 | A | * | 3/2007 | ......... H01L 27/3276 |
| CN | 110515247 | A | * | 11/2019 | ............. H01L 27/32 |

(Continued)

*Primary Examiner* — Lin Li
(74) *Attorney, Agent, or Firm* — H.C. Park & Associates, PLC

(57) ABSTRACT

A display device including a transmission area, a display area at least partially surrounding the transmission area, and a non-display area between the transmission area and the display area, in which the display device includes a driving voltage line extending in a first direction and arranged in the display area, a data line extending in the first direction and arranged in the display area, an auxiliary data line connected to the data line and extending along an edge of the transmission area in the non-display area, and a conductive pattern arranged in the non-display area and connected to the driving voltage line.

23 Claims, 20 Drawing Sheets

(51) Int. Cl.
*H10K 77/10* (2023.01)
*H10K 102/00* (2023.01)

(56) References Cited

U.S. PATENT DOCUMENTS

| | | | |
|---|---|---|---|
| 2017/0162111 A1* | 6/2017 | Kang | H10K 50/844 |
| 2017/0288003 A1* | 10/2017 | Kim | H10K 59/1213 |
| 2018/0097200 A1 | 4/2018 | Park et al. | |
| 2019/0131375 A1* | 5/2019 | Kim | H01L 27/3276 |
| 2019/0165080 A1 | 5/2019 | Ito | |
| 2019/0229175 A1* | 7/2019 | Lhee | H01L 27/3223 |
| 2020/0058728 A1 | 2/2020 | Song et al. | |
| 2020/0167028 A1 | 5/2020 | Morrison et al. | |
| 2020/0176539 A1 | 6/2020 | Sung et al. | |
| 2020/0243610 A1 | 7/2020 | Han et al. | |
| 2021/0083038 A1 | 3/2021 | Jeon et al. | |
| 2021/0091165 A1 | 3/2021 | Jeon et al. | |
| 2021/0159300 A1 | 5/2021 | Cha et al. | |
| 2022/0005913 A1* | 1/2022 | Xiao | G09G 3/006 |
| 2022/0045300 A1* | 2/2022 | He | H10K 59/1213 |
| 2022/0115453 A1* | 4/2022 | Shi | H10K 59/65 |
| 2022/0115487 A1* | 4/2022 | Shu | H10K 59/1213 |

FOREIGN PATENT DOCUMENTS

| | | | | |
|---|---|---|---|---|
| CN | 111123597 | | 5/2020 | |
| CN | 111312074 A | * | 6/2020 | G09F 9/30 |
| CN | 210983365 U | * | 7/2020 | G06F 3/044 |
| CN | WO 2021226785 A1 | * | 11/2021 | H01L 27/3276 |
| EP | 3826059 | | 5/2021 | |
| JP | 2019102147 | | 6/2019 | |
| KR | 20150025994 | | 3/2015 | |
| KR | 20160119909 | | 10/2016 | |
| KR | 20200006081 | | 1/2020 | |
| KR | 20200017677 | | 2/2020 | |
| KR | 20200021029 | | 2/2020 | |

\* cited by examiner

DISPLAY DEVICE

CROSS-REFERENCE TO RELATED APPLICATION

This application claims priority from and the benefit of Korean Patent Application No. 10-2020-0100750, filed on Aug. 11, 2020, the contents of which are hereby incorporated by reference for all purposes as if fully set forth herein.

BACKGROUND

Field

Embodiments/implementations of the invention relate generally to a display device and, more specifically, to a display device for a smart phone, a tablet computer, or the like. One or more embodiments relate to a display device including a transmission area inside a display area.

Discussion of the Background

Recently, the usage of display devices has diversified. Also, display devices have become thinner and lighter, and thus, the uses of display devices have expanded.

As the area of a display area in display devices has expanded, various functions that are applied to or associated with display devices have been added. As a way of adding various functions while expanding the area of the display area, research has been conducted into display devices in which various elements may be arranged in a display area.

The above information disclosed in this Background section is only for understanding of the background of the inventive concepts, and, therefore, it may contain information that does not constitute prior art.

SUMMARY

Devices constructed according to implementations/embodiments of the invention are capable of providing additional functions for display devices by use of a component area provided within a non-display area inside a display area, in which the component area includes a transmission area and in which conductive patterns for pixels in the display area are provided in the non-display area that surrounds the component area and that is provided between the component area and the display area, such that the device operates with improved reliability.

One or more embodiments include a high-quality display device including a transmission area within a display area, the transmission area capable of transmitting light as an area for adding various functions to the display device. However, such a technical problem is an example, and the inventive concepts are not limited thereto.

Additional features of the inventive concepts will be set forth in the description which follows, and in part will be apparent from the description, or may be learned by practice of the inventive concepts.

According to one or more embodiments, a display device includes a transmission area, a display area surrounding the transmission area, and a non-display area between the transmission area and the display area. The display device includes a driving voltage line extending in a first direction and arranged in the display area, a data line extending in the first direction and arranged in the display area, an auxiliary data line connected to the data line and extending along an edge of the transmission area in the non-display area, and a conductive pattern arranged in the non-display area and connected to the driving voltage line.

A plurality of slits may be defined in the conductive pattern.

The display device may further include a conductive layer surrounding the transmission area, arranged in the non-display area, and connected to the driving voltage line.

The display device may further include a bridge arranged in the non-display area and connecting the driving voltage line and the conductive layer to each other.

The bridge may be connected to the conductive pattern.

A width of a first portion of the conductive layer arranged in a first area of the non-display area may be different from that of a second portion of the conductive layer arranged in a second area of the non-display area.

The conductive layer may overlap the auxiliary data line.

The conductive layer may cover the non-display area and may overlap the auxiliary data line and the conductive pattern.

The display device may further include a pixel circuit arranged in the display area, connected to the driving voltage line and the data line, and including a thin-film transistor and a capacitor, and a display element connected to the pixel circuit.

The conductive pattern may be arranged on the same layer as a gate electrode of the thin-film transistor or an upper electrode of the capacitor, wherein the conductive layer may be arranged on the same layer as a source electrode and a drain electrode of the thin-film transistor.

The display device may further include an insulating layer arranged on the conductive layer and including an uneven upper surface.

According to one or more embodiments, a display device includes a transmission area, a display area at least partially surrounding the transmission area, and a non-display area between the transmission area and the display area. The display device includes a first driving voltage line extending in a first direction and arranged in the display area, a second driving voltage line extending in the first direction and spaced apart from the first driving voltage line in the display area, a first data line extending in the first direction and arranged in the display area, a second data line extending in the first direction and spaced apart from the first data line in the display area, a first auxiliary data line connected to the first data line and extending along an edge of the transmission area in the non-display area, a second auxiliary data line connected to the second data line, extending along the edge of the transmission area in the non-display area, and arranged on a different layer from the first auxiliary data line, and a conductive pattern arranged between the first auxiliary data line and the second auxiliary data line in the non-display area and having a plurality of slits.

The conductive pattern may include a first conductive pattern arranged on the same layer as the first auxiliary data line and a second conductive pattern arranged on the same layer as the second auxiliary data line.

The first conductive pattern may be connected to the first driving voltage line, wherein the second conductive pattern may be connected to the second driving voltage line.

The display device may further include a conductive layer surrounding the transmission area, arranged in the non-display area, and connected to the first driving voltage line and the second driving voltage line.

The conductive layer, the first driving voltage line, and the second driving voltage line may be arranged on the same layer as one another.

The display device may further include a first bridge connecting the conductive layer and the first driving voltage line to each other in the non-display area, and a second bridge connecting the conductive layer and the second driving voltage line to each other in the non-display area.

The conductive pattern may include a first conductive pattern arranged on the same layer as the first auxiliary data line and a second conductive pattern arranged on the same layer as the second auxiliary data line, wherein the first conductive pattern may be connected to the first bridge, wherein the second conductive pattern may be connected to the second bridge.

The conductive pattern may be arranged on the same layer as the first auxiliary data line or the second auxiliary data line.

The conductive layer may overlap at least a portion of the first auxiliary data line and the second auxiliary data line.

The display device may further include a pixel circuit arranged in the display area, connected to the first driving voltage line and the first data line, and including a thin-film transistor and a capacitor, and a display element connected to the pixel circuit.

The conductive pattern may be arranged on the same layer as a gate electrode of the thin-film transistor or an upper electrode of the capacitor, wherein the conductive layer may be arranged on the same layer as a source electrode and a drain electrode of the thin-film transistor.

The display device may further include an insulating layer arranged on the conductive layer and including an uneven upper surface.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION OF THE ILLUSTRATED EMBODIMENTS

Figure 1:
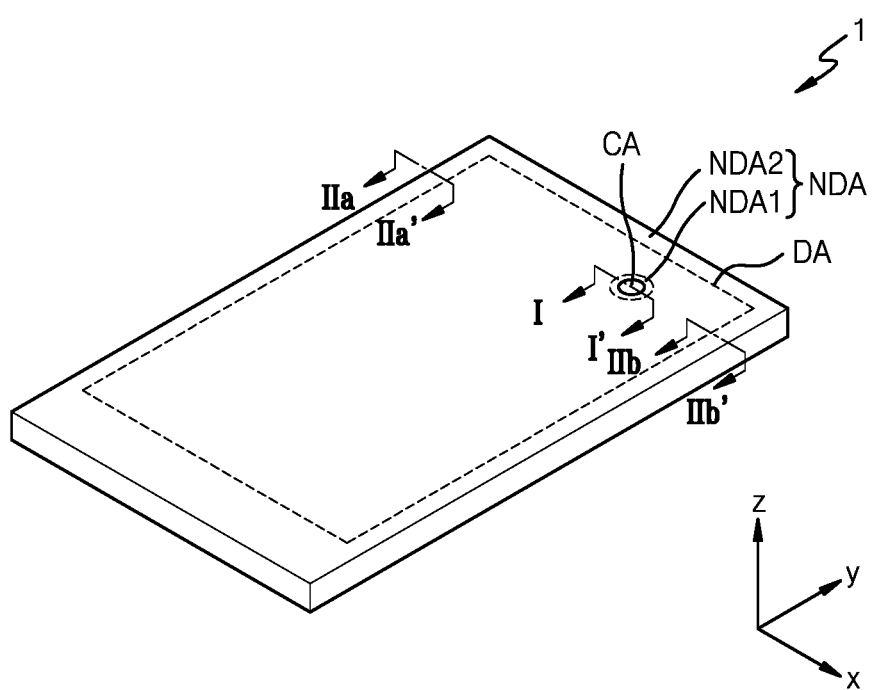
FIG. 1 is a schematic perspective view of a display device according to an embodiment.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

According to one or more embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, a display device, and/or one or more components thereof may include or otherwise be associated with one or more memories (not shown) including code (e.g., instructions) configured to cause the display device, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CD-RW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

The x-axis, the y-axis, and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

In the following disclosure, the meaning of a wire "extending in a first direction or a second direction" includes not only extending in a straight line but also extending in a zigzag or curve along the first or second direction.

In the following disclosure, a "plan view" indicates that a portion of a target object is seen from above, and a "cross-sectional view" indicates that a portion of a target object is vertically cut and the cross-section is viewed from the side. In the following disclosure, when a first element is referred to as "overlapping" a second element, the first element is above or below the second element.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a schematic perspective view of a display device 1 according to an embodiment.

Referring to FIG. 1, the display device 1 may include a display area DA where light is emitted and a non-display area NDA where no light is emitted. The display device 1 may output a certain image by using light emitted from a plurality of pixels arranged in the display area DA.

The display device 1 may include a component area CA. The component area CA may be at least partially surrounded by the display area DA. For example, as shown in FIG. 1, the component area CA may be entirely surrounded by the display area DA.

The non-display area NDA may include a first non-display area NDA1 surrounding the component area CA and a second non-display area NDA2 surrounding the perimeter of the display area DA. For example, the first non-display area NDA1 may entirely surround the component area CA, the display area DA may entirely surround the first non-display area NDA1, and the second non-display area NDA2 may entirely surround the display area DA.

As described below with reference to FIG. 2A, etc., the component area CA may be a location where a component is arranged. The component area CA may be a transmission area capable of transmitting light and/or sound output from the component to the outside or receiving light and/or sound traveling from the outside toward the component. According to an embodiment, when light is transmitted through the component area CA, the light transmittance may be about 50% or more, and more particularly, may be 70% or more, 75% or more, 80% or more, 85% or more, or 90% or more.

Although an organic light-emitting display device is described below as an example of the display device 1 according to an embodiment, a display device described herein is not limited thereto. According to another embodiment, the display device 1 may be a display device such as an inorganic light-emitting display device (or an inorganic electroluminescent (EL) display device) or a quantum dot light-emitting display device. For example, an emission layer of a display element included in the display device 1 may include an organic material, may include an inorganic material, may include quantum dots, may include an organic material and quantum dots, or may include an inorganic material and quantum dots.

Although FIG. 1 shows the component area CA arranged on one side (an upper right side) of the display area DA having a quadrilateral (i.e., rectangular) shape, the disclosure is not limited thereto. For example, a shape of the display area DA may be a circle, an oval, or a polygon such as a triangle or a pentagon, and a location of the component area CA may also be variously changed. For example, the component area CA may be arranged at an upper center of a plane (e.g., an x-y plane) of the display area DA.

FIGS. 2A to 2D are schematic cross-sectional views of the display device 1 according to embodiments. For example, FIGS. 2A to 2D may correspond to a cross-section according to line I-I' of FIG. 1.

Figure 2A:
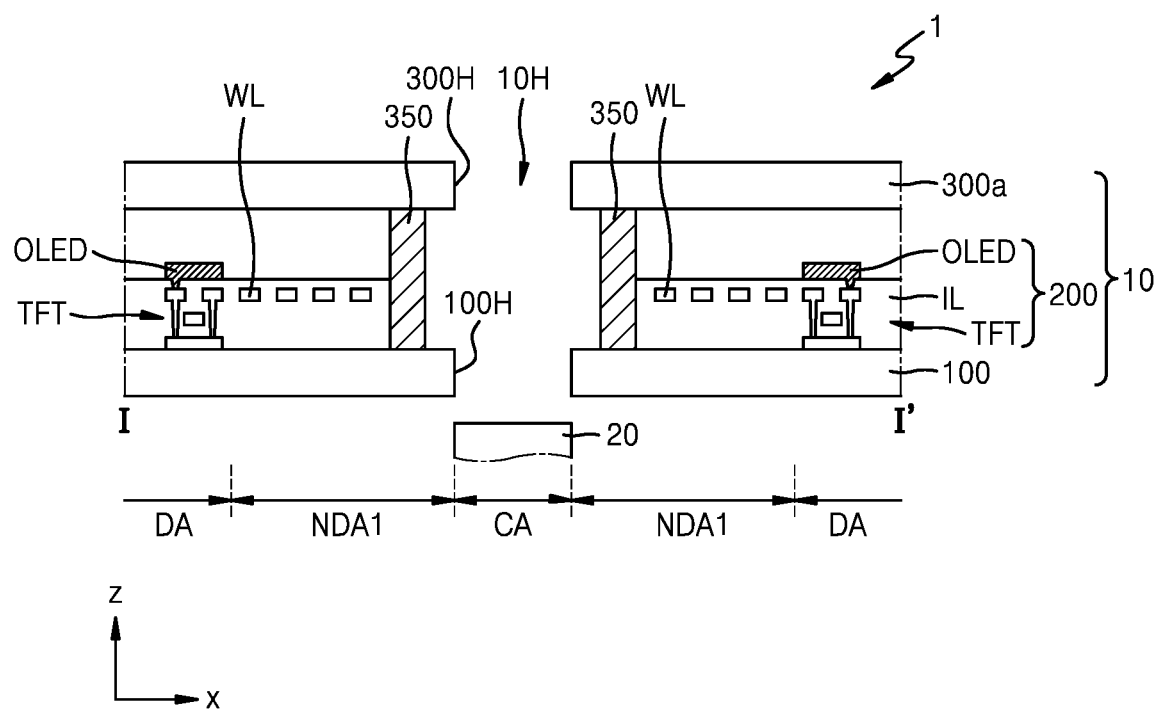
FIGS. 2A, 2B, 2C, and 2D are schematic cross-sectional views of a display device according to embodiments.

Referring to FIG. 2A, the display device 1 may include a display panel 10 including a display element and a component 20 corresponding to the component area CA.

The display panel 10 may include a substrate 100, an encapsulation substrate 300a as an encapsulation member facing the substrate 100, a display layer 200 therebetween, and a sealing material 350 (sealant) covering the side of the display layer 200 that may be arranged between the substrate 100 and the encapsulation substrate 300a. FIG. 2A shows the sealing material 350 arranged on both sides of the component area CA. However, in a view in a direction vertical to a main surface of the substrate 100, the component area CA may be entirely surrounded by the sealing material 350.

The substrate 100 may include glass or a polymer resin. The polymer resin may include polyethersulfone (PES), polyarylate (PAR), polyetherimide (PEI), polyacrylate, polyethylene naphthalate (PEN), polyethylene terephthalate, polyphenylene sulfide (PPS), polyimide (PI), polycarbonate (PC), cellulose triacetate (TAC), cellulose acetate propionate (CAP), etc. The substrate 100 including the polymer resin may be flexible, rollable, or bendable. The substrate 100 may have a multi-layer structure including a layer including the above-described polymer resin and an inorganic layer (not shown). The encapsulation substrate 300a may include glass or the above-described polymer resin.

The display layer 200 may include a circuit layer including a thin-film transistor TFT, an organic light-emitting diode OLED as a display element connected to the thin-film transistor TFT, and an insulating layer IL therebetween. The thin-film transistor TFT and the organic light-emitting diode OLED connected thereto may be arranged in the display area DA, and some wires WL of the display layer 200 may be in the first non-display area NDA1. Wires WL may be configured to provide a certain signal or voltage to pixels spaced apart from each other with the component area CA therebetween. FIG. 2A shows the wires WL not overlapping the sealing material 350 in the first non-display area NDA1. However, according to another embodiment, a portion of the sealing material 350 may overlap a wire WL. The insulating layer IL may include one or more inorganic insulating layers and/or organic insulating layers.

The display panel 10 may include a through hole 10H corresponding to the component area CA. For example, the substrate 100 and the encapsulation substrate 300a may respectively include through holes 100H and 300H corresponding to the component area CA. The display layer 200 may also include a through hole corresponding to the component area CA.

Although not shown, elements such as an input sensing member for sensing a touch input, an anti-reflection member including a polarizer and a retarder or a color filter and a black matrix, and a transparent window may be further arranged on the display panel 10.

The component 20 may be in the component area CA. The component 20 may be an electronic element that uses light or sound. For example, the electronic element may be a sensor, such as an infrared sensor, receiving and using light, a camera receiving light to capture an image, a sensor outputting and sensing light or sound to measure a distance or recognize a fingerprint, a small lamp outputting light, or a speaker outputting sound. The electronic element using light may use light within various wavelength ranges, such as visible light, infrared light, ultraviolet light, etc. As shown in FIG. 2A, when the display panel 10 includes the through hole 10H corresponding to the component area CA, light or sound output or received by the electronic element may be used more effectively.

Figure 2B:
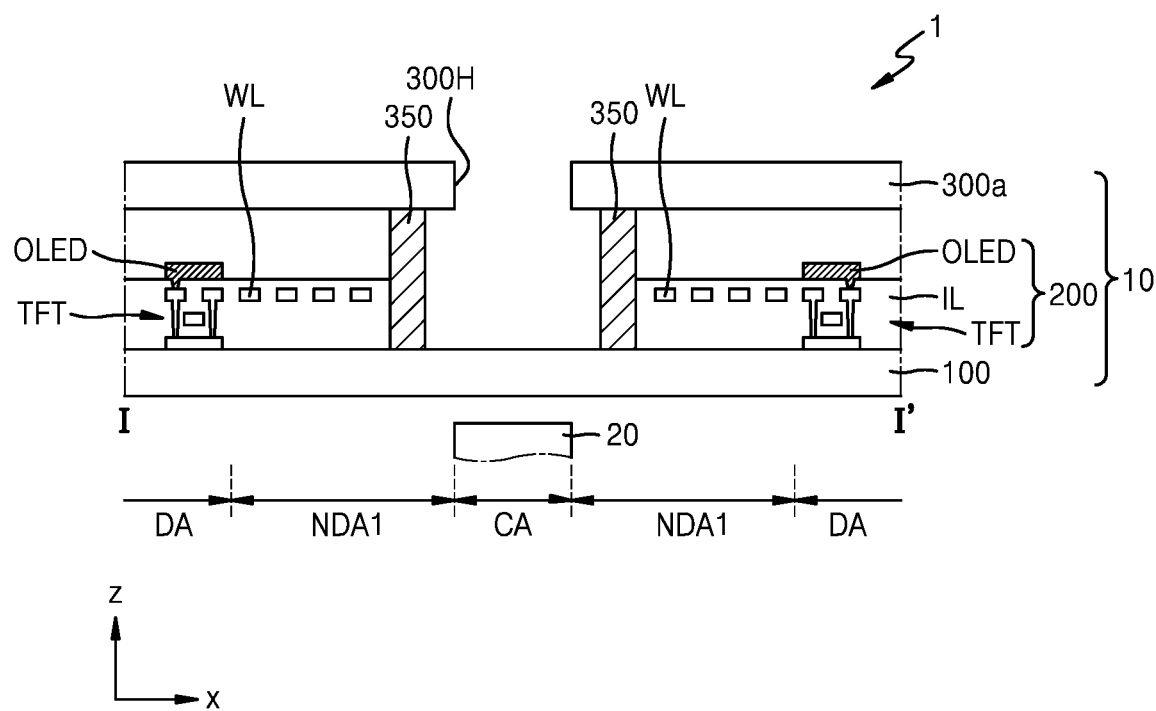
Figure 2C:
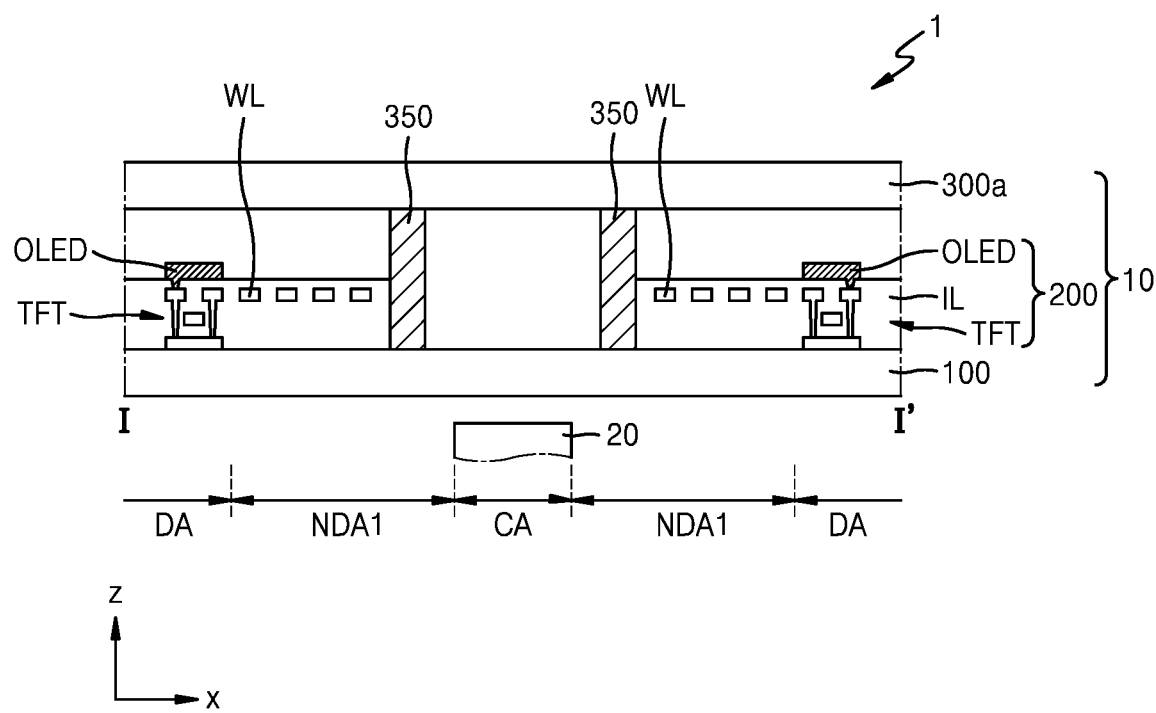
Figure 2D:
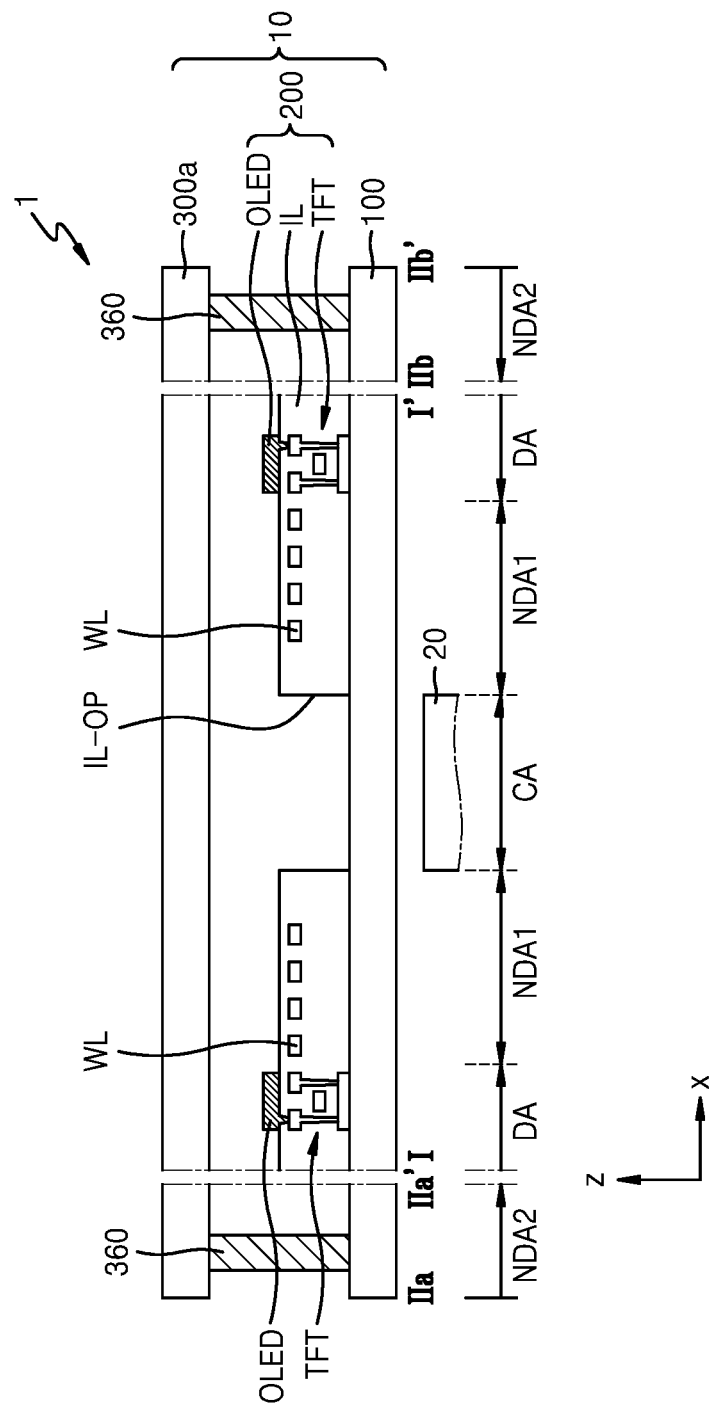

In FIG. 2A, the display panel 10 may include the through hole 10H corresponding to the component area CA, whereas some elements of the display panel 10 may include no through hole. For example, as shown in FIG. 2B, the encapsulation substrate 300a may include the through hole 300H corresponding to the component area CA, whereas the substrate 100 may include no through hole. Alternatively, as shown in FIGS. 2C and 2D, neither the substrate 100 nor the encapsulation substrate 300a may include a through hole corresponding to the component area CA. In FIG. 2C, the sealing material 350 may be arranged in the first non-display area NDA1 to surround the component area CA.

In FIG. 2D, unlike FIG. 2C, the sealing material 350 may not be included around the component area CA. FIG. 2D further includes cross-sections according to lines IIa-IIa' and IIb-IIb' of FIG. 1. A peripheral sealing material 360 may be in the second non-display area NDA2, and the display layer 200 may be sealed from external air by bonding the substrate 100 and the encapsulation substrate 300a to each other. Although not shown, the display device 1 of FIGS. 2A to 2C may also include the peripheral sealing material 360 to surround the perimeter of the display area DA.

The insulating layer IL of FIG. 2D may have an opening IL-OP corresponding to the component area CA. In an embodiment, there may be no element arranged between the substrate 100 and the encapsulation substrate 300a to correspond to the component area CA. In another embodiment, an inorganic insulating layer (some inorganic insulating layers) such as a buffer layer may partially remain in the component area CA on the substrate 100.

FIGS. 2A to 2D show the component 20 arranged below the display panel 10, that is, on one side of the substrate 100. However, in FIG. 2A, the component 20 may be at least partially inserted in the through hole 10H to overlap the side of the display panel 10 defining the through hole 10H.

The component 20 may include another member in addition to the above-described electronic element. In an embodiment, when the display panel 10 is used as a smartwatch or a vehicle dashboard, the component 20 may be a member including clock hands or a needle indicating certain information (e.g., a vehicle speed, etc.). Alternatively, the component 20 may include an element such as an accessory increasing the aesthetics of the display panel 10.

Figure 3A:
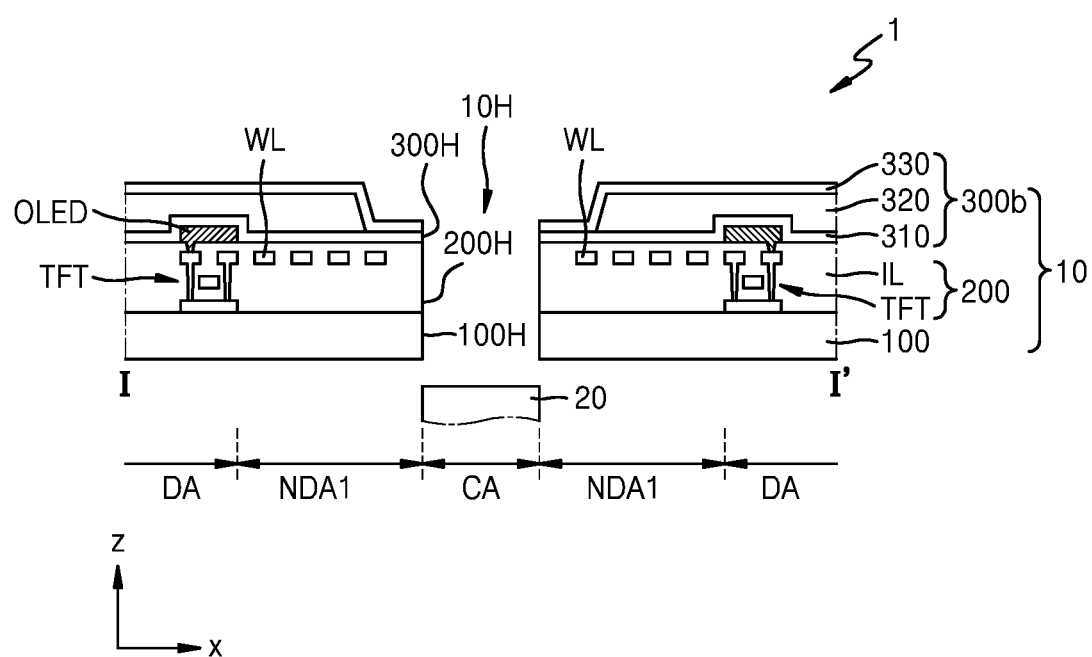
FIGS. 3A, 3B, and 3C are schematic cross-sectional views of a display device according to other embodiments.
Figure 3B:
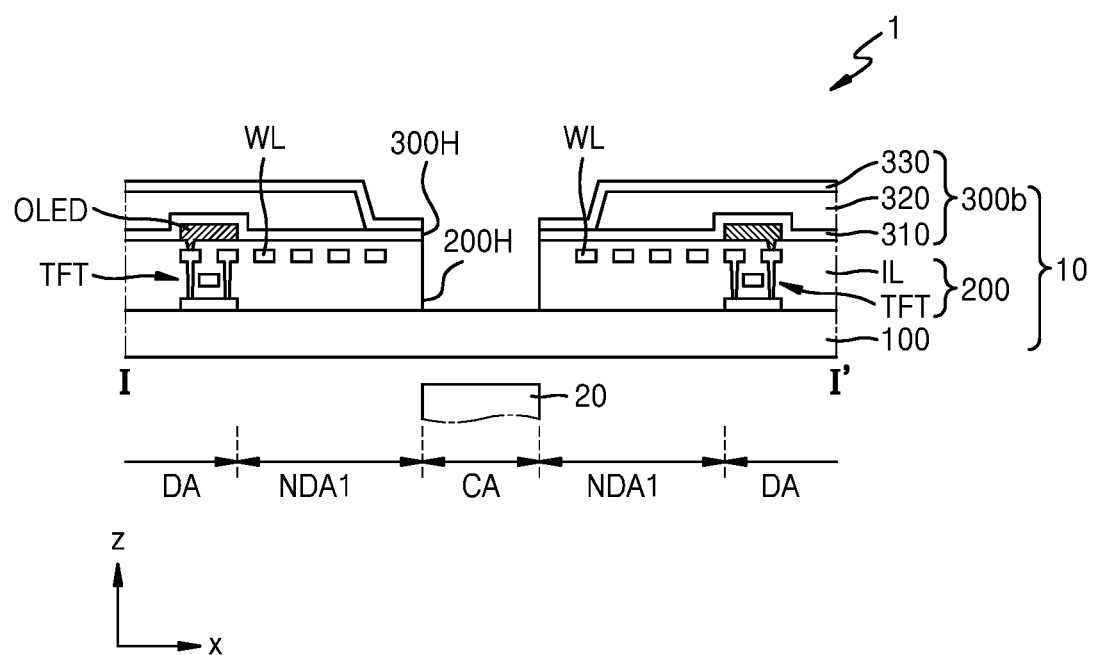
Figure 3C:
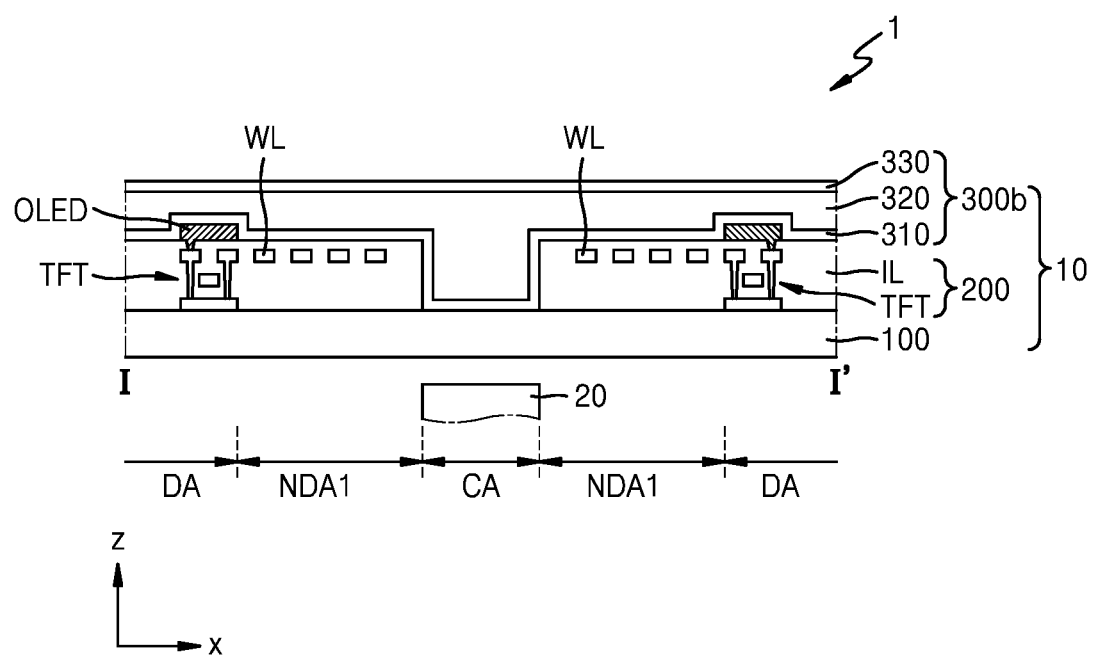

FIGS. 3A to 3C are schematic cross-sectional views of the display device 1 according to other embodiments and may correspond to a cross-section according to line I-I' of FIG. 1.

Referring to FIG. 3A, the display device 1 may include the display panel 10 and the component 20 as the display device 1 described above with reference to FIG. 2A does. Although not shown, the display device 1 may further include an input sensing member for sensing a touch input, an anti-reflection member, and a window, which are arranged on the display panel 10.

The display panel 10 described above with reference to FIG. 2A may include the encapsulation substrate 300a and the sealing material 350 as encapsulation members, whereas the display panel 10 according to the present embodiment may include a thin-film encapsulation layer 300b as an encapsulation member. When the display panel 10 uses the thin-film encapsulation layer 300b as an encapsulation member, the flexibility of the display panel 10 may further improve. Hereinafter, differences will be mainly described for convenience of explanation.

The thin-film encapsulation layer 300b may include at least one inorganic encapsulation layer and at least one organic encapsulation layer. For example, as shown in FIG. 3A, the thin-film encapsulation layer 300b may include a first inorganic encapsulation layer 310, a second inorganic encapsulation layer 330, and an organic encapsulation layer 320 therebetween.

The first inorganic encapsulation layer 310 and the second inorganic encapsulation layer 330 may include one or more inorganic insulating materials such as aluminum oxide, titanium oxide, tantalum oxide, hafnium oxide, zinc oxide, silicon oxide, silicon nitride, silicon oxynitride, etc. The organic encapsulation layer 320 may include a polymer-based material. The polymer-based material may include an acrylic resin, an epoxy resin, PI, and polyethylene.

The display panel 10 may include the through hole 10H corresponding to the component area CA. For example, the substrate 100, the display layer 200, and the thin-film encapsulation layer 300b may include through holes 100H, 200H, and 300H corresponding to the component area CA. The thin-film encapsulation layer 300b, for example, the first inorganic encapsulation layer 310, the second inorganic encapsulation layer 330, and the organic encapsulation layer 320, may include a hole corresponding to the component area CA. A size of a hole of the organic encapsulation layer 320 may be greater than sizes of holes of the first and second inorganic encapsulation layers 310 and 330, and the first inorganic encapsulation layer 310 and the second inorganic encapsulation layer 330 may contact each other around the component area CA.

Unlike that shown in FIG. 3A, some elements of the display panel 10 may include no through hole. For example, as shown in FIG. 3B, the display layer 200 and the thin-film encapsulation layer 300b may include the through holes 200H and 300H corresponding to the component area CA, whereas the substrate 100 may include no through hole. In another example, as shown in FIG. 3C, neither the substrate 100 nor the thin-film encapsulation layer 300b may include a through hole corresponding to the component area CA.

As shown in FIGS. 3B and 3C, even when the substrate 100 does not include the through hole 100H, as portions of the display layer 200 corresponding to the component area CA are at least partially removed, light transmittance for the electronic element, which is the component 20, may be secured.

When the thin-film encapsulation layer 300b includes no through hole, the at least one inorganic encapsulation layer and the at least one organic encapsulation layer may each cover the substrate 100 in the component area CA. For example, the display layer 200 between the substrate 100 and the thin-film encapsulation layer 300b may not cover a portion of the substrate 100 corresponding to the component area CA, and the portion of the substrate 100 corresponding to the component area CA may be covered by the thin-film encapsulation layer 300b.

In FIGS. 3A to 3C, the insulating layer IL corresponding to the component area CA is completely removed. However, according to another embodiment, the display panel 10 may have only some of multi-layer insulating layers IL removed to correspond to the component area CA.

FIGS. 3A to 3C show the component 20 arranged below the display panel 10, that is, on one side of the substrate 100. However, in FIG. 3A, the component 20 may be at least partially inserted in the through hole 10H to overlap the side of the display panel 10 defining the through hole 10H.

Figure 4:
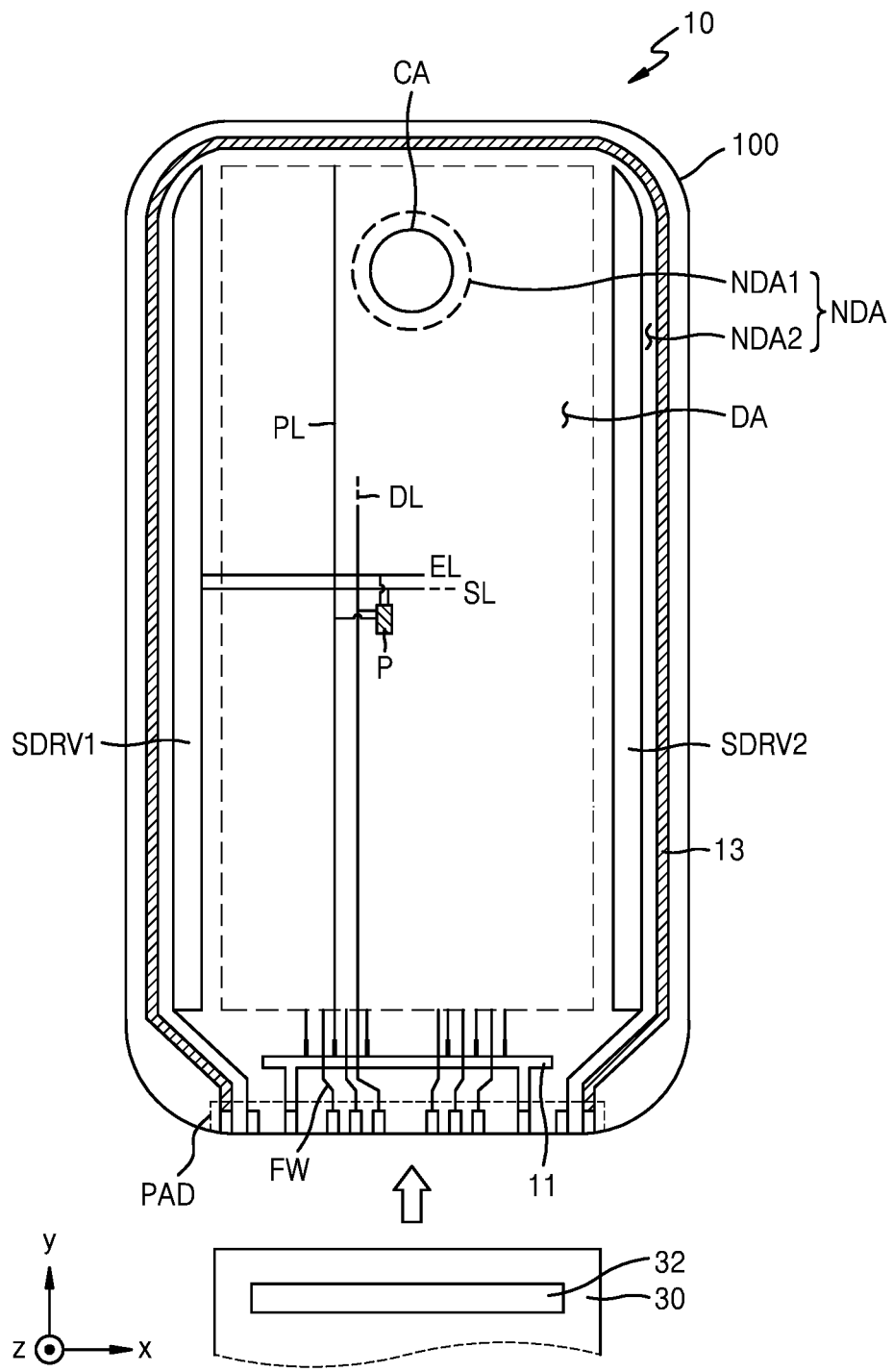
FIG. 4 is a schematic plan view of a display panel according to an embodiment.

FIG. 4 is a schematic plan view of the display panel 10 according to an embodiment.

Referring to FIG. 4, various elements constituting the display panel 10 are arranged on the substrate 100. That is, the substrate 100 may include the display area DA corresponding to the display area DA and the non-display area NDA of the display panel 10 and the non-display area NDA surrounding the display area DA.

A plurality of pixels P may be arranged in the display area DA. The plurality of pixels P may each be implemented by a display element such as the organic light-emitting diode OLED. Each pixel P may emit, for example, red, green, blue, or white light.

The first non-display area NDA1 may surround the component area CA. The first non-display area NDA1 is an area where no display element is arranged, and signal lines configured to provide a signal to the pixels P arranged around the component area CA may pass through the first non-display area NDA1. Pixel circuits configured to drive the pixels P may each be electrically connected to peripheral circuits arranged in the second non-display area NDA2. A first scan driving circuit SDRV1, a second scan driving circuit SDRV2, a terminal portion PAD, a driving voltage supply line 11, and a common voltage supply line 13 may be arranged in the second non-display area NDA2.

The first scan driving circuit SDRV1 may be configured to apply a scan signal SL to each of the pixel circuits configured to drive the pixels P through a scan line SL. The first scan driving circuit SDRV1 may be configured to apply an emission control signal EL to each pixel circuit through an emission control line EL. The second scan driving circuit SDRV2 may be opposite to the first scan driving circuit SDRV1 with respect to the display area DA and may be substantially parallel to the first scan driving circuit SDRV1. Some of the pixel circuits of the pixels P of the display area DA may be electrically connected to the first scan driving circuit SDRV1, and the others may be electrically connected to the second scan driving circuit SDRV2.

The terminal portion PAD may be arranged on one side of the substrate 100. The terminal portion PAD is not covered by an insulating layer but is exposed and connected to a display circuit board 30. A display driver 322 may be arranged on the display circuit board 30.

The display driver 322 may generate a control signal which is transmitted to the first scan driving circuit SDRV1 and the second scan driving circuit SDRV2. The display driver 322 may generate a data signal, and the generated data signal may be transmitted to the pixel circuits of the pixels P through a fan-out wire FW and a data line DL connected to the fan-out wire FW.

The display driver 322 may supply a driving voltage ELVDD to the driving voltage supply line 11 and may supply a common voltage ELVSS (refer to FIG. 5) to the common voltage supply line 13. The driving voltage ELVDD may be applied to the pixel circuits of the pixels P through a driving voltage line PL connected to the driving voltage supply line 11, and the common voltage ELVSS may be applied to a common electrode of display elements through the common voltage supply line 13.

The driving voltage supply line 11 may be connected to the terminal portion PAD and may extend in an x direction on a lower side of the display area DA. In another embodiment, a driving voltage supply line extending in the x direction on an upper side of the display area DA may be further included. In this case, some pixels may be connected to the driving voltage supply line arranged on a lower side of the display area DA, and some pixels may be connected to the driving voltage supply line arranged on an upper side of the display area DA. The common voltage supply line 13 may be connected to the terminal portion PAD, and may have a shape in which one side is open in a loop shape, and thus may partially surround the display area DA.

Although not shown, an initialization voltage supply line configured to supply an initialization voltage Vint (refer to FIG. 5) may be further arranged in the second non-display area NDA2 of the display panel 10, and the initialization voltage supply line may be configured to supply the initialization voltage Vint to a pixel P through an initialization voltage line VL (refer to FIG. 5) of the display area DA. As the first and second scan driving circuits SDRV1 and SDRV2 are arranged, the initialization voltage supply line may be arranged on each of left and right sides of the substrate 100 with the display area DA therebetween.

Figure 5:
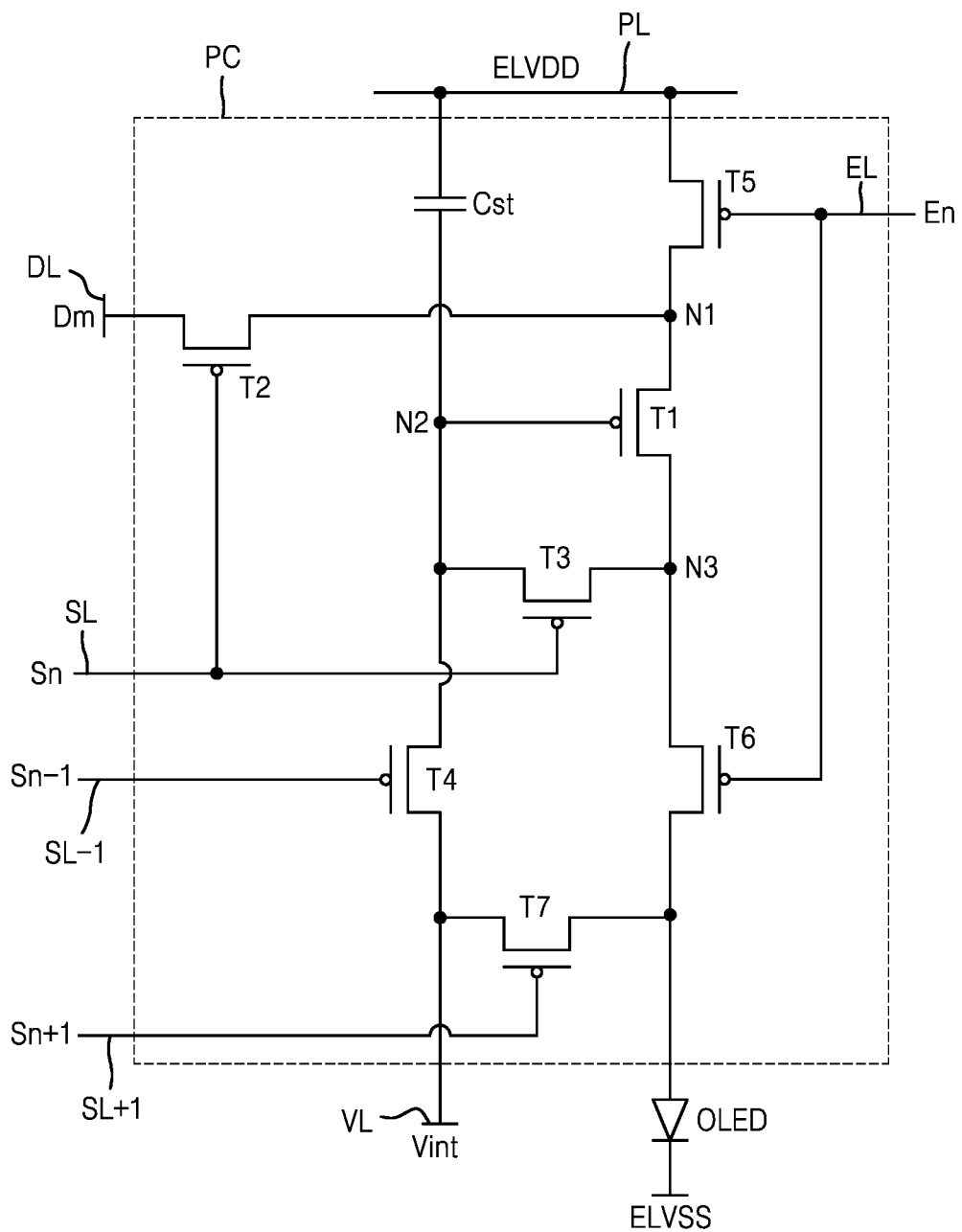
FIG. 5 is an equivalent circuit diagram of a pixel arranged in a display panel according to an embodiment.

FIG. 5 is an equivalent circuit diagram of the pixel P arranged in a display panel according to an embodiment.

The pixel P includes a pixel circuit PC and the organic light-emitting diode OLED as a display element connected to the pixel circuit PC. The pixel circuit PC may include first to seventh transistors T1 to T7, and depending on the type (p-type or n-type) and/or operation condition of a transistor, a first terminal of each of the first to seventh transistors T1 to T7 may be a source terminal or a drain terminal, and a second terminal may be a terminal different from the first terminal. For example, the first terminal may be a source terminal, and the second terminal may be a drain terminal.

The pixel circuit PC may be connected to a current scan line SL configured to transmit a current scan signal Sn, a previous scan line SL−1 configured to transmit a previous scan signal Sn−1, a next scan line SL+1 configured to transmit a next scan signal Sn+1, the emission control line EL configured to transmit an emission control signal En, the data line DL configured to transmit a data signal Dm, the driving voltage line PL configured to transmit the driving voltage ELVDD, and the initialization voltage line VL configured to transmit the initialization voltage Vint.

The first transistor T1 includes a gate terminal connected to a second node N2, a first terminal connected to a first node N1, and a second terminal connected to a third node N3. The first transistor T1 serves as a driving transistor and is configured to receive the data signal Dm according to a switching operation of the second transistor T2 and supply a driving current to a light-emitting device. The light-emitting device may be the organic light-emitting diode OLED.

The second transistor T2 (switching transistor) includes a gate terminal connected to the current scan line SL, a first terminal connected to the data line DL, and a second terminal connected to the first node N1 (or the first terminal of the first transistor T1). The second transistor T2 may be turned on according to the current scan signal Sn received via the current scan line SL to perform a switching operation for transmitting the data signal Dm received via the data line DL to the first node N1.

The third transistor T3 (compensation transistor) includes a gate terminal connected to the current scan line SL, a first terminal connected to the second node N2 (or the gate terminal of the first transistor T1), and a second terminal connected to the third node N3 (or the second terminal of the first transistor T1). The third transistor T3 may be turned on according to the current scan signal Sn received via the current scan line SL to diode-connect the first transistor T1 to compensate a threshold voltage of the first transistor T1. The third transistor T3 may have a structure in which two or more transistors are connected in series.

The fourth transistor T4 (first initialization transistor) includes a gate terminal connected to the previous scan line SL−1, a first terminal connected to the initialization voltage line VL, and a second terminal connected to the second node N2. The fourth transistor T4 may be turned on according to the previous scan signal Sn−1 received via the previous scan line SL−1 to initialize a gate voltage of the first transistor T1 by transmitting the initialization voltage Vint to the gate terminal of the first transistor T1. The fourth transistor T4 may have a structure in which two or more transistors are connected in series.

The fifth transistor T5 (first emission control transistor) includes a gate terminal connected to the emission control line EL, a first terminal connected to the driving voltage line PL, and a second terminal connected to the first node N1. The sixth transistor T6 (second emission control transistor) includes a gate terminal connected to the emission control line EL, a first terminal connected to the third node N3, and a second terminal connected to a pixel electrode of the organic light-emitting diode OLED. The fifth transistor T5 and the sixth transistor T6 may be simultaneously turned on according to the emission control signal En received via the emission control line EL so that a current flows through the organic light-emitting diode OLED.

The seventh transistor T7 (second initialization transistor) includes a gate terminal connected to the next scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on according to the next scan signal Sn+1 received via the next scan line SL+1 to initialize a voltage of the pixel electrode of the organic light-emitting diode OLED by transmitting the initialization voltage Vint to the pixel electrode of the organic light-emitting diode OLED. The seventh transistor T7 may be omitted.

A capacitor Cst includes a first electrode connected to the second node N2 and a second electrode connected to the driving voltage line PL. The capacitor Cst may be connected to the driving voltage line PL and the gate terminal of the first transistor T1 to maintain a voltage applied to a gate electrode of the first transistor T1 by storing and maintaining a voltage corresponding to a voltage difference between both ends.

The organic light-emitting diode OLED may include a pixel electrode and a common electrode facing the pixel electrode, and the common electrode may receive the common voltage ELVSS. The organic light-emitting diode OLED may receive a driving current from the first transistor T1 and thus may emit light in a certain color, thereby displaying an image. The common electrode may be provided in common, that is, integrally with a plurality of pixels.

Although FIG. 5 shows the fourth transistor T4 and the seventh transistor T7 respectively connected to the second scan line SL−1 and the third scan line SL+1, the disclosure is not limited thereto. According to another embodiment, both of the fourth transistor T4 and the seventh transistor T7 may be connected to the previous scan line SL−1 and be driven according to the previous scan signal Sn−1.

Figure 6:
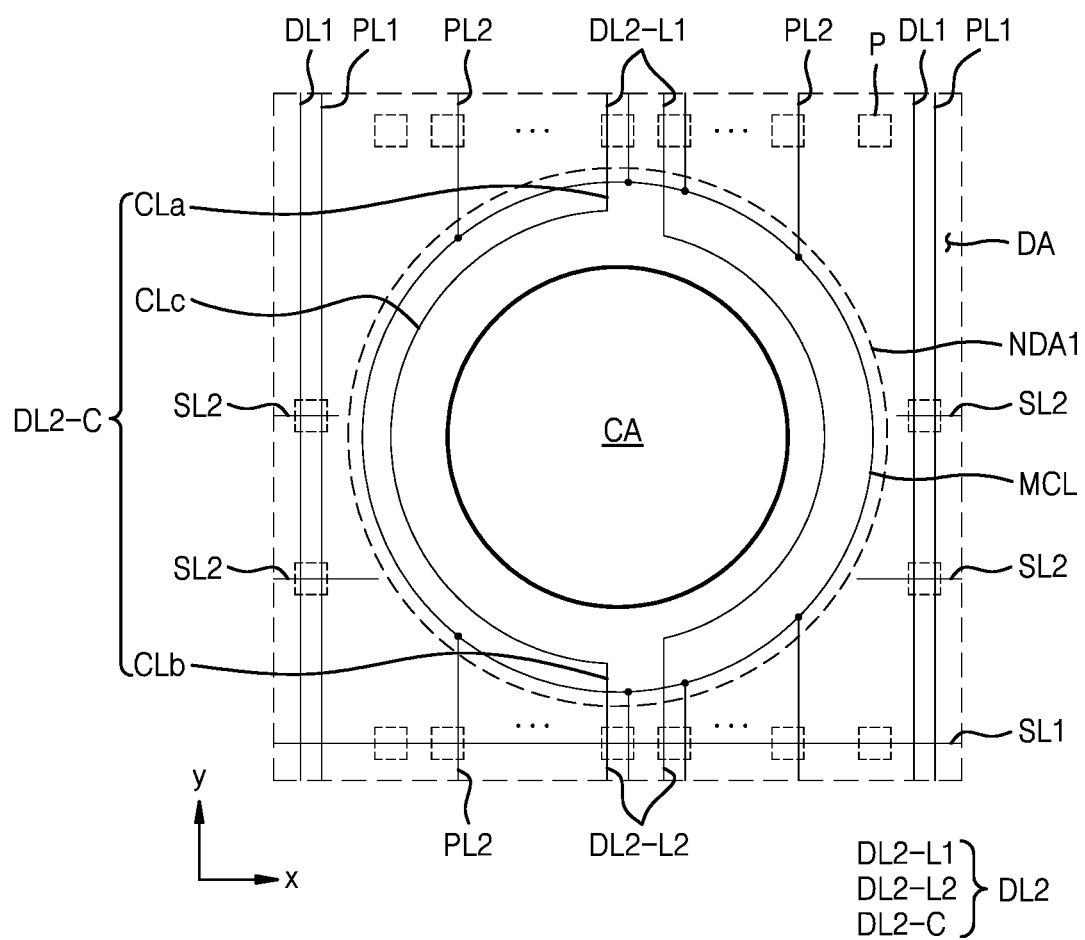
FIG. 6 is a plan view of a portion of a display panel according to an embodiment.

FIG. 6 is a plan view of a portion of a display panel according to an embodiment. The plan view of FIG. 6 shows only a portion of the display panel, and thus, more pixels are omitted. In addition, the plan view of FIG. 6 shows only wires necessary for explanation, and thus, more wires are omitted. This plan view shows the component area CA and a portion of the display area DA around the component area CA.

Referring to FIG. 6, some of the pixels P formed in the display area DA may be spaced apart from each other with the component area CA therebetween. For example, the component area CA may be between two pixels P arranged in the x direction of FIG. 6. Similarly, the component area CA may be between two pixels P arranged in a y direction of FIG. 6. In the display area DA, the data line DL and the driving voltage line PL may be spaced apart from each other in each column, and the scan line SL, an emission control line (not shown), and an initialization voltage line (not shown) may be spaced apart from one another in each row.

The data line DL may extend in the y direction and may be configured to transmit a data signal to the pixel P. The data line DL may include a first data line DL1 and a second data line DL2. The first data line DL1 may be connected to the pixels P arranged in the same column in the display area DA. The second data line DL2 may be connected to the pixels P arranged in the same column with the component area CA and the first non-display area NDA1 therebetween in the display area DA. That is, two pixels P of the same column (that is, two display elements of the same column) arranged in the y direction with the component area CA and the first non-display area NDA1 therebetween may be connected to the second data line DL2.

The second data line DL2 may include a first sub-data line DL2-L1 and a second sub-data line DL2-L2 arranged in the display area DA and an auxiliary data line DL2-C arranged in the first non-display area NDA1. The first sub-data line DL2-L1 may extend in they direction and may be arranged on an upper side of the component area CA. The second sub-data line DL2-L2 may extend in the y direction and may be arranged on a lower side of the component area CA. The auxiliary data line DL2-C may extend in an arc direction of the component area CA along the edge of the component area CA in the first non-display area NDA1 and may connect the first sub-data line DL2-L1 and the second sub-data line DL2-L2 to each other. The auxiliary data line DL2-C may be bent in the first non-display area NDA1. The auxiliary data line DL2-C may include a first portion CLa and a second portion CLb extending parallel to the y direction and a third portion CLc extending at a certain curvature in the arc direction of the component area CA. The third portion CLc may connect the first portion CLa and the second portion CLb to each other between the first portion CLa and the second portion CLb.

In an embodiment, the first sub-data line DL2-L1, the second sub-data line DL2-L2, and the auxiliary data line DL2-C may be an integrated wire. In another embodiment, the auxiliary data line DL2-C may be arranged on a different layer from the first sub-data line DL2-L1 and the second sub-data line DL2-L2 and may be electrically connected to the first sub-data line DL2-L1 and the second sub-data line DL2-L2 through a contact hole. The auxiliary data line DL2-C may be arranged on an upper layer of the first sub-data line DL2-L1 and the second sub-data line DL2-L2 or may be arranged on a lower layer of the first sub-data line DL2-L1 and the second sub-data line DL2-L2.

The scan line SL may extend in the x direction and may be configured to transmit a scan signal to the pixel P. The scan line SL may be the current scan line SL, the previous scan line SL−1 and/or the next scan line SL+1 of FIG. 5. The scan line SL may include a first scan line SL1 and a second scan line SL2. The first scan line SL1 may be electrically connected to the pixels P arranged in the same row in the display area DA. The second scan line SL2 may be disconnected or separated with the component area CA and the first non-display area NDA1 therebetween. The second scan line SL2 arranged on a left side of the component area CA and the second scan line SL2 arranged on a right side of the component area CA may be spaced apart from each other with the component area CA therebetween. That is, two pixels P of the same row (that is, two display elements of the same row) arranged in the x direction with the component area CA therebetween may be electrically connected to different second scan lines SL2, respectively. Second scan lines SL2 arranged on the left side of the component area CA may be electrically connected to the first scan driver SDRV1 (refer to FIG. 4), and second scan lines SL2 arranged on the right side of the component area CA may be electrically connected to the second scan driver SDRV2 (refer to FIG. 4).

The driving voltage line PL may extend in the y direction and may be configured to transmit the driving voltage ELVDD to the pixel P. The driving voltage line PL may include a first driving voltage line PL1 and a second driving voltage line PL2. The first driving voltage line PL1 may be electrically connected to the pixels P arranged in the same column in the display area DA. The second driving voltage line PL2 may be disconnected or separated with the component area CA therebetween. The second driving voltage line PL2 arranged on an upper side of the component area CA and the second driving voltage line PL2 arranged on a lower side of the component area CA may be spaced apart from each other with the component area CA therebetween. That is, two pixels P of the same column (that is, two display elements of the same column) arranged in the y direction with the component area CA therebetween may be electrically connected to different second driving voltage lines PL2, respectively.

Second driving voltage lines PL2 may be connected to a conductive layer MCL. The conductive layer MCL may be arranged in the first non-display area NDA1 and may extend in a circumferential direction of the component area CA and surround the component area CA. In an embodiment, the conductive layer MCL may have a linear structure. In another embodiment, the conductive layer MCL may have a plate-shaped structure arranged to cover substantially all of the first non-display area NDA1. For example, the conductive layer MCL may have a doughnut shape including an opening corresponding to the component area CA. In an embodiment, a width of the conductive layer MCL in a diameter direction may be different for each location. In another embodiment, a width of the conductive layer MCL may be uniform. The connection between the second driving voltage line PL2 and the conductive layer MCL will be described later.

Although not shown, an emission control line and an initialization voltage line may be further arranged on a substrate of the display panel. Emission control lines EL (refer to FIG. 5) may extend in the x direction, and some of the emission control lines EL may be disconnected with the component area CA therebetween. Emission control lines arranged on the left side of the component area CA may be electrically connected to the first scan driver SDRV1 (refer to FIG. 4), and emission control lines arranged on the right side of the component area CA may be electrically connected to the second scan driver SDRV2 (refer to FIG. 4). Initialization voltage lines VL (refer to FIG. 5) may extend in the x direction, and some of the initialization voltage lines VL may be disconnected with the component area CA therebetween. Initialization voltage lines arranged on the left side of the component area CA may be electrically connected to a left initialization voltage driving line, and initialization voltage lines arranged on the right side of the component area CA may be electrically connected to a right initialization voltage driving line.

Figure 7:
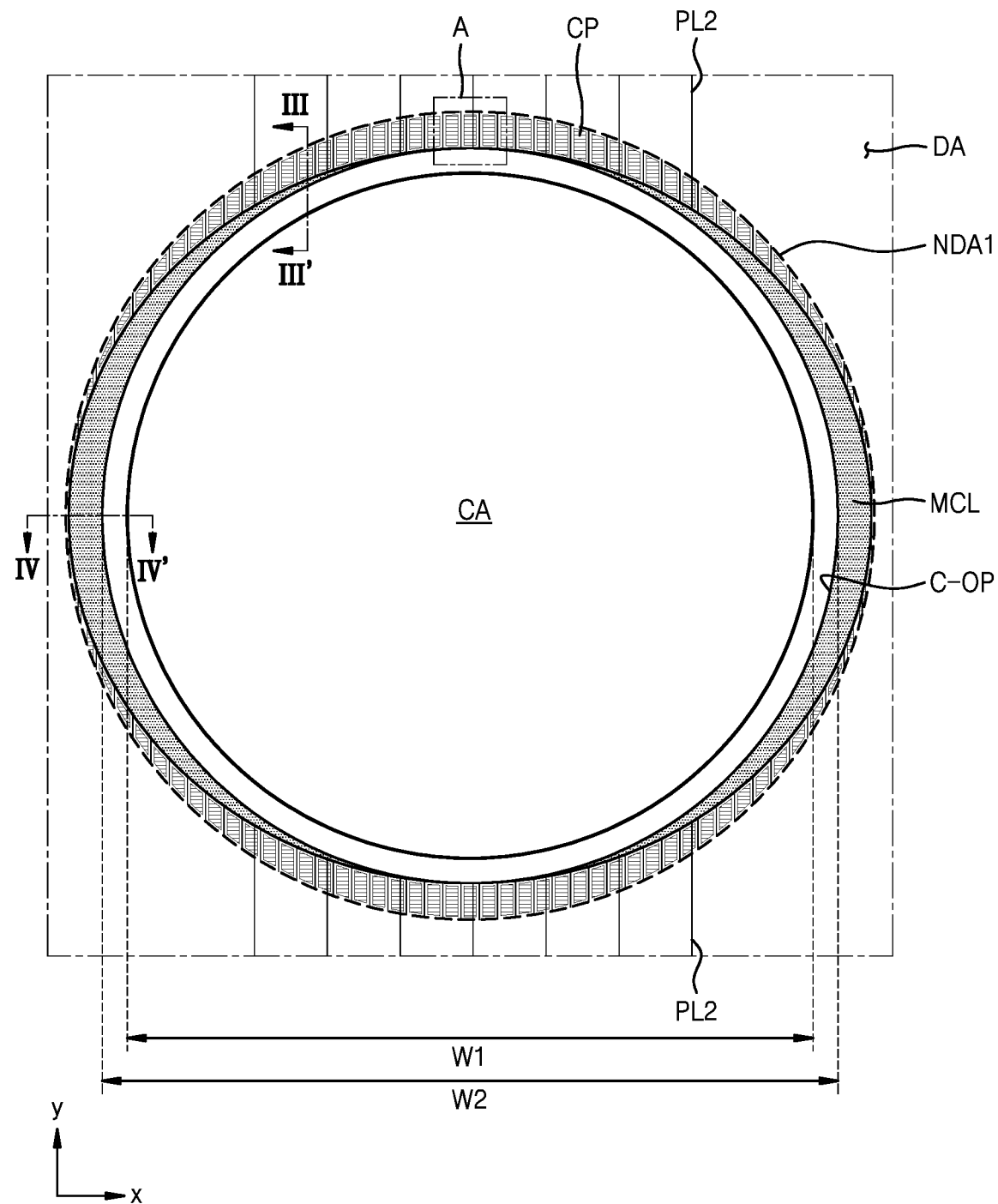
FIG. 7 is a plan view of wires around a component area according to an embodiment.
Figure 8A:
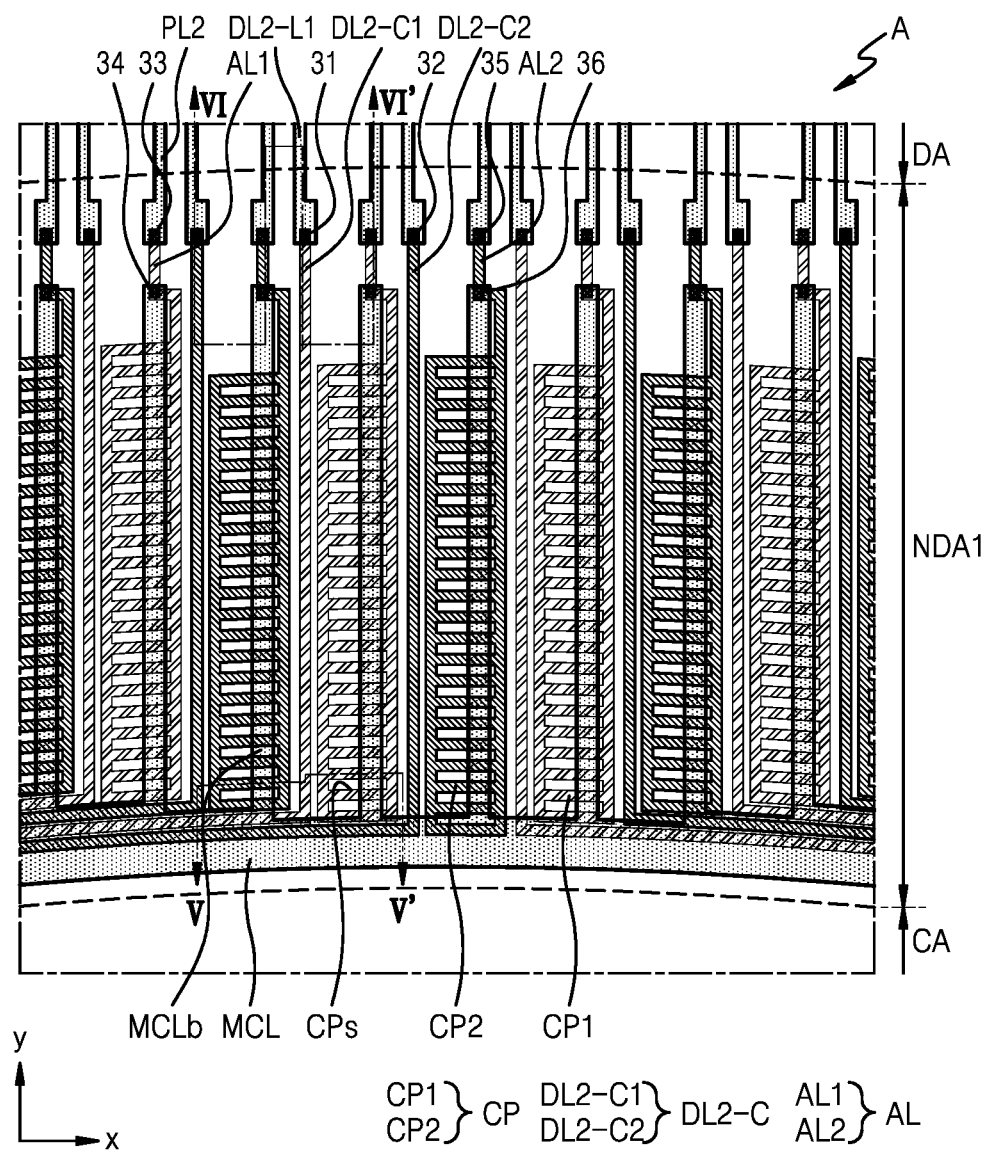
FIG. 8A is an enlarged plan view of region A of FIG. 7.
Figure 8B:
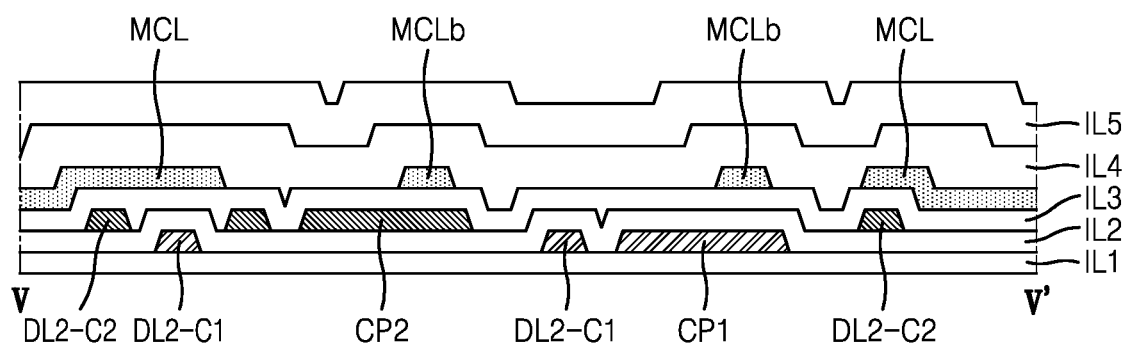
FIG. 8B is a cross-sectional view of the display device, taken along line V-V' of FIG. 8A.
Figure 8C:
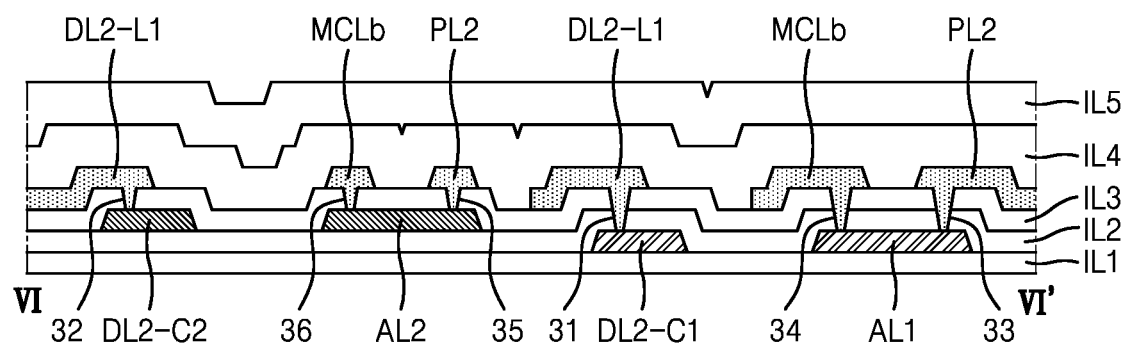
FIG. 8C is a cross-sectional view of the display device, taken along line VI-VI' of FIG. 8A.
Figure 9:
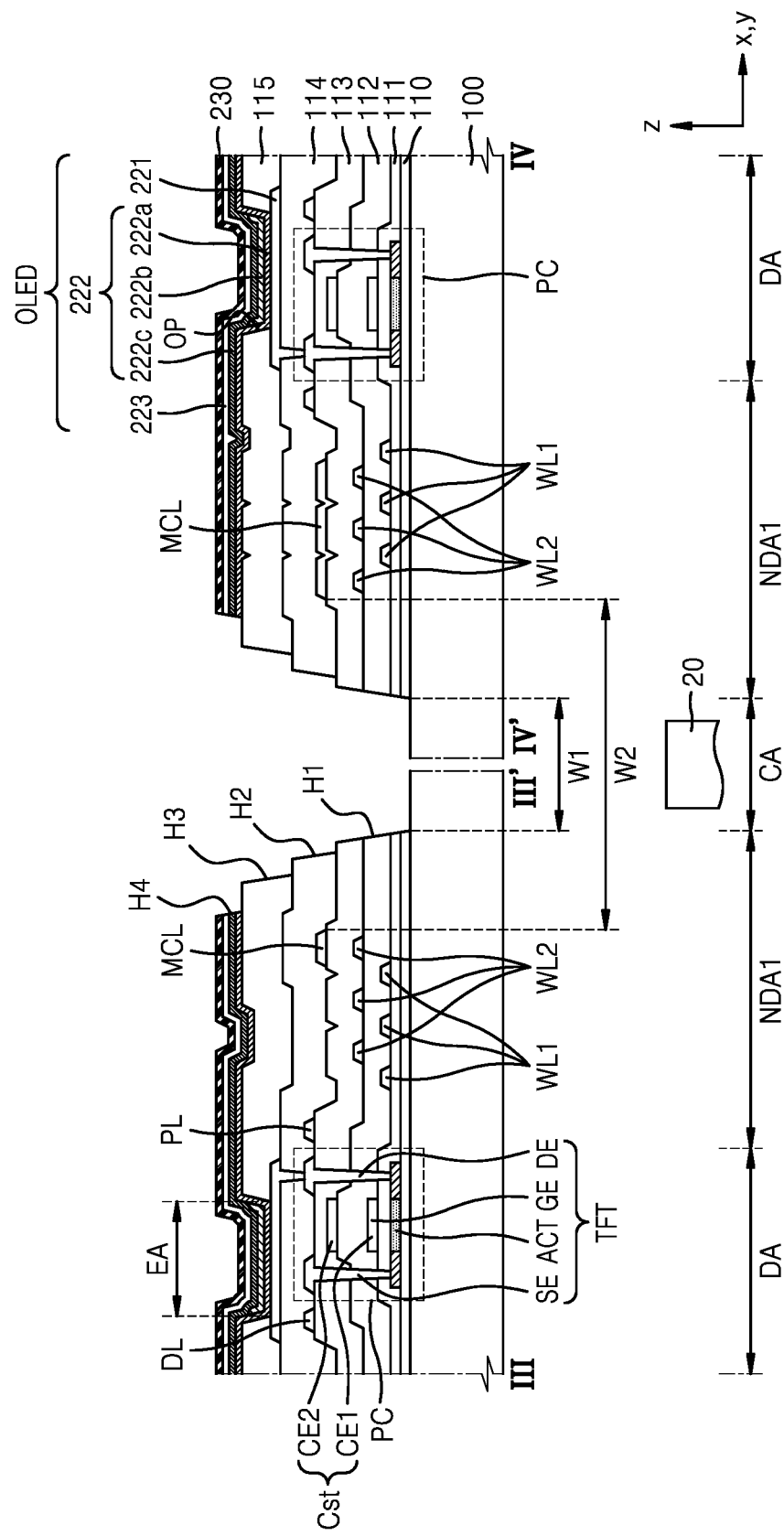
FIG. 9 is a cross-sectional view of the display device, taken along lines III-III' and IV-IV' of FIG. 7.

FIG. 7 is a plan view of wires around the component area CA according to an embodiment. FIG. 8A is an enlarged plan view of region A of FIG. 7. FIG. 8B is a cross-sectional view of the display device, taken along line V-V' of FIG. 8A. FIG. 8C is a cross-sectional view of the display device, taken along line VI-VI' of FIG. 8A. FIG. 9 is a cross-sectional view of the display device, taken along lines III-III' and IV-IV' of FIG. 7.

Referring to FIG. 7, the second driving voltage line PL2 may be connected to the conductive layer MCL. In an embodiment, the second driving voltage line PL2 and the conductive layer MCL may be integrally formed with each other. In another embodiment, the second driving voltage line PL2 and the conductive layer MCL may be separately formed and may be connected to each other through a bridge AL (refer to FIG. 8A). In another embodiment, some of the second driving voltage lines PL2 may be integrated with the conductive layer MCL, and the others may be connected to the conductive layer MCL through the bridge AL.

The conductive layer MCL may extend along an arc of the component area CA and may be arranged in the first non-display area NDA1. The conductive layer MCL may include an opening C-OP corresponding to the component area CA. A width W2 of the opening C-OP may be greater than a width W1 of the component area CA. The conductive layer MCL may have a minimum width in upper and lower regions of the first non-display area NDA1 and may have a maximum width in left and right regions of the first non-display area NDA1. In a region between an upper side and a left or right side of the first non-display area NDA1, a width of the conductive layer MCL may gradually increase or decrease. For example, a width of the conductive layer MCL may be minimum in upper region of the first non-display area NDA1, and may gradually increase toward left and right regions of the first non-display area NDA1 and thus may be maximum in the left and right regions of the first non-display area NDA1. Likewise, in a region between a lower region and a left or right regions of the first non-display area NDA1, a width of the conductive layer MCL may gradually increase or decrease.

As shown in FIG. 8A, the conductive layer MCL may include a branch MCLb extending in the y direction from a main body, and the second driving voltage line PL2 and the conductive layer MCL may be arranged on the same layer as each other. An end of the branch MCLb may face an end of the second driving voltage line PL2. The end of the second driving voltage line PL2 may be in the first non-display area NDA1 near a boundary between the display area DA and the first non-display area NDA1. The end of the branch MCLb may be connected to the second driving voltage line PL2 through the bridge AL.

The bridge AL may include a first bridge AL1 and a second bridge AL2. The first bridge AL1 and the second bridge AL2 may be arranged on different layers, respectively. As shown in FIGS. 8B and 8C, the conductive layer MCL may be arranged on a third insulating layer IL3, the first bridge AL1 may be arranged on a first insulating layer IL1, and the second bridge AL2 may be arranged on a second insulating layer IL2. The second driving voltage line PL2 and the branch MCLb may be respectively connected to the first bridge AL1 through contact holes 33 and 34 of the second insulating layer IL2 and the third insulating layer IL3 or may be respectively connected to the second bridge AL2 through contact holes 35 and 36 of the third insulating layer IL3. Accordingly, the conductive layer MCL may receive the driving voltage ELVDD from the second driving voltage line PL2. The first bridge AL1 and the second bridge AL2 may be alternately arranged in an arc direction of the component area CA.

As shown in FIG. 8A, the first sub-data line DL2-L1 of the second data line DL2 may be connected to the auxiliary data line DL2-C. The auxiliary data line DL2-C may include a first auxiliary data line DL2-C1 and a second auxiliary data line DL2-C2. The first auxiliary data line DL2-C1 and the second auxiliary data line DL2-C2 may be arranged on different layers from each other. The first auxiliary data line DL2-C1 and the second auxiliary data line DL2-C2 may be arranged on a different layer from the second data line DL2. In an embodiment, as shown in FIGS. 8B and 8C, the first auxiliary data line DL2-C1 may be arranged on the first insulating layer IL1, the second auxiliary data line DL2-C2 may be arranged on the second insulating layer IL2, and the first sub-data line DL2-L1 of the second data line DL2 may be arranged on the third insulating layer IL3. Although not shown, the second sub-data line DL2-L2 of the second data line DL2 may also be arranged on the third insulating layer IL3.

The first sub-data line DL2-L1 may be connected to the first auxiliary data line DL2-C1 through a contact hole 31 of the second insulating layer IL2 and the third insulating layer IL3 or may be connected to the second auxiliary data line DL2-C2 through a contact hole 32 of the third insulating layer IL3. Likewise, the second sub-data line DL2-L2 may be connected to the first auxiliary data line DL2-C1 through the contact hole 31 of the second insulating layer IL2 and the third insulating layer IL3 or may be connected to the second auxiliary data line DL2-C2 through the contact hole 32 of the third insulating layer IL3. The first auxiliary data line DL2-C1 and the second auxiliary data line DL2-C2 may be alternately arranged in the arc direction of the component area CA.

As the first auxiliary data line DL2-C1 and the second auxiliary data line DL2-C2 are arranged on different layers from each other, a distance between neighboring auxiliary data lines arranged on different layers from each other may be narrow, and thus, the area of a non-display area may be reduced. In FIG. 8A, respective third portions CLc (refer to FIG. 6) of the first auxiliary data line DL2-C1 and the second auxiliary data line DL2-C2 may be close to each other in a plan view. In another embodiment, respective third portions CLc (refer to FIG. 6) of the first auxiliary data line DL2-C1 and the second auxiliary data line DL2-C2 may partially overlap each other.

The conductive layer MCL may at least partially cover third portions CLc of the first auxiliary data line DL2-C1 and the second auxiliary data line DL2-C2. In an embodiment, as shown in FIG. 8A, the conductive layer MCL may cover all of the third portions CLc of the first auxiliary data line DL2-C1 and the second auxiliary data line DL2-C2.

In the first non-display area NDA1, a conductive pattern CP may be arranged around the conductive layer MCL. The conductive pattern CP may be arranged between a pair of adjacent auxiliary data lines DL2-C. For example, the conductive pattern CP may be arranged between the first auxiliary data line DL2-C1 and the second auxiliary data line DL2-C2 in a plan view. The branch MCLb of the conductive layer MCL may overlap the conductive pattern CP.

The conductive pattern CP may include a first conductive pattern CP1 and a second conductive pattern CP2 arranged on different layers from each other. The first conductive pattern CP1 may be arranged on the same layer as the first auxiliary data line DL2-C1 and the first bridge AL1. For example, as shown in FIG. 8B, the first conductive pattern CP1 may be arranged on the first insulating layer IL1. The second conductive pattern CP2 may be arranged on the same layer as the second auxiliary data line DL2-C2 and the second bridge AL2. For example, as shown in FIG. 8B, the second conductive pattern CP2 may be arranged on the second insulating layer IL2.

The first conductive pattern CP1 and the second conductive pattern CP2 may each have a structure in which comb teeth are arranged in parallel in the y direction and connected to each other to form a slit CPs between the comb teeth. The first conductive pattern CP1 and the second conductive pattern CP2 may have a plurality of slits CPs, and thus, as shown in FIGS. 8B and 8C, upper surfaces of insulating layers (for example, second to fifth insulating layers IL2 to IL5) on the first conductive pattern CP1 and the second conductive pattern CP2 may be uneven. Sizes of the first conductive pattern CP1 and the second conductive pattern CP2 may be different from each other. That is, the number of comb teeth and/or the number of slits of the first conductive pattern CP1 and the second conductive pattern CP2 may be different from each other. The first conductive pattern CP1 and the second conductive pattern CP2 may be alternately arranged in the curved (i.e., arc) direction of the component area CA. A constant voltage may be applied to the first conductive pattern CP1 and the second conductive pattern CP2.

In an embodiment, the first conductive pattern CP1 may be connected to the first bridge AL1, and the second conductive pattern CP2 may be connected to the second bridge AL2. The first conductive pattern CP1 may have a structure integrated with the first bridge AL1, and the second conductive pattern CP2 may have a structure integrated with the second bridge AL2. As the first conductive pattern CP1 and the second conductive pattern CP2 are connected to the first bridge AL1 and the second bridge AL2, respectively, the driving voltage ELVDD may be applied to the first conductive pattern CP1 and the second conductive pattern CP2. As a constant voltage such as the driving voltage ELVDD is applied to the first conductive pattern CP1 and the second conductive pattern CP2, damage to the display panel due to electrostatic discharge may be prevented or reduced. The first conductive pattern CP1 and the second conductive pattern CP2 may also be connected to the conductive layer MCL.

As the conductive pattern CP is provided in a region where the main body of the conductive layer MCL and/or the auxiliary data line DL2-C are not arranged, wiring density deviation in the first non-display area NDA1 due to the arrangement of the conductive layer MCL and/or the auxiliary data line DL2-C may be reduced.

Figure 10:
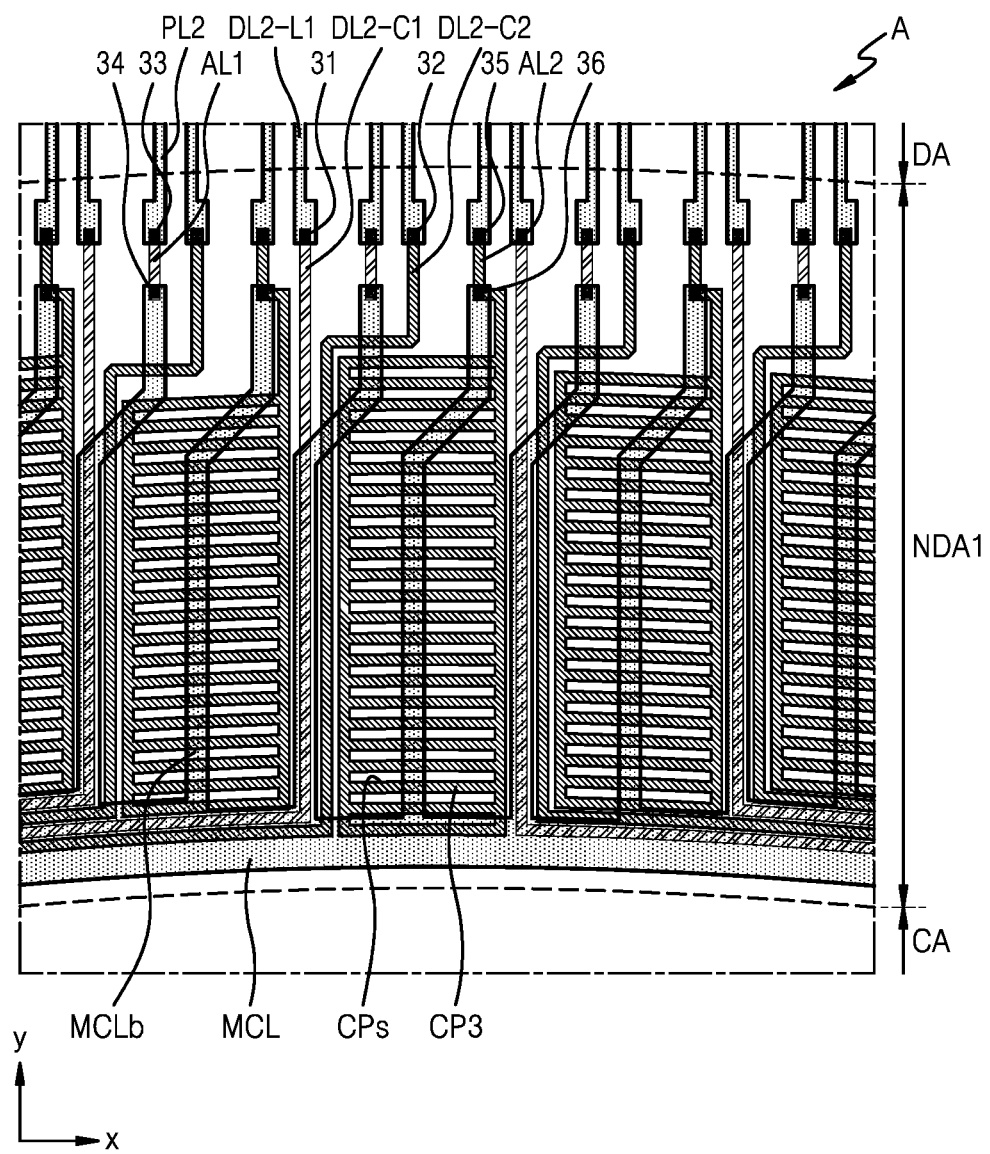
FIG. 10 is an enlarged plan view of region A of FIG. 7 according to another embodiment.

In FIG. 8A, branches MCLb of the conductive layer MCL are straight line and overlap the first conductive pattern CP1 or the second conductive pattern CP2. In another embodiment, the conductive layer MCL may overlap the first auxiliary data line DL2-C1 and the second auxiliary data line DL2-C2. For example, as shown in FIG. 10, each branch MCLb of the conductive layer MCL may be bent to overlap the first auxiliary data line DL2-C1 or the second auxiliary data line DL2-C2 from above the first auxiliary data line DL2-C1 or the second auxiliary data line DL2-C2.

Hereinafter, a stacking relationship of elements arranged in the display panel will be described with reference to FIG. 9.

Referring to FIG. 9, the pixel circuit PC may be arranged above the substrate 100, and the organic light-emitting diode OLED electrically connected to the pixel circuit PC may be arranged above the pixel circuit PC. As described above with reference to FIG. 2A, the substrate 100 may include glass or a polymer resin. The substrate 100 may have a single-layer or multi-layer structure.

A buffer layer 110 may be formed on the substrate 100 to prevent or reduce penetration of impurities into a semiconductor layer ACT of the thin-film transistor TFT. The buffer layer 110 may include an inorganic insulating material such as silicon nitride, silicon oxynitride and/or silicon oxide and may have a single-layer or multi-layer structure including the above-described inorganic insulating material.

The pixel circuit PC may be arranged on the buffer layer 110. The pixel circuit PC may include the thin-film transistor TFT and the capacitor Cst. The thin-film transistor TFT may include the semiconductor layer ACT, a gate electrode GE, a source electrode SE, and a drain electrode DE. The thin-film transistor TFT shown in FIG. 9 may be one of the transistors described with reference to FIG. 5, for example, a driving transistor. In the present embodiment, a top-gate-type thin-film transistor in which the gate electrode GE is arranged above the semiconductor layer ACT with a first gate insulating layer 111 therebetween is illustrated. However, according to another embodiment, the thin-film transistor TFT may be a bottom-gate-type thin-film transistor.

The semiconductor layer ACT may include polysilicon. Alternatively, the semiconductor layer ACT may include amorphous silicon, may include an oxide semiconductor, or may include an organic semiconductor. The gate electrode GE may include a low-resistance metal material. The gate electrode GE may include a conductive material including molybdenum (Mo), aluminum (Al), copper (Cu), titanium (Ti), etc. and may have a single-layer or multi-layer structure including the material described above.

The source electrode SE and the drain electrode DE may include a conductive material including molybdenum (Mo), aluminum (Al), copper (Cu), titanium (Ti), etc. and may have a single-layer or multi-layer structure including the material described above. In an embodiment, the source electrode SE and the drain electrode DE may have a multi-layer structure of Ti/Al/Ti. The source electrode SE and the drain electrode DE may be arranged on an interlayer insulating layer 113. The data line DL and the driving voltage line PL connected to the pixel circuit PC may be further arranged on the interlayer insulating layer 113.

The capacitor Cst may include a lower electrode CE1 and an upper electrode CE2 overlapping each other with a second gate insulating layer 112 therebetween. The capacitor Cst may overlap the thin-film transistor TFT. FIG. 9 shows that the gate electrode GE of the thin-film transistor TFT is the lower electrode CE1 of the capacitor Cst. In another embodiment, the capacitor Cst may not overlap the thin-film transistor TFT. The capacitor Cst may be covered by the interlayer insulating layer 113.

The first gate insulating layer 111, the second gate insulating layer 112, and the interlayer insulating layer 113 may each include an inorganic insulating material such as silicon oxide, silicon nitride, silicon oxynitride, aluminum oxide, titanium oxide, tantalum oxide, hafnium oxide, etc. The first gate insulating layer 111, the second gate insulating layer 112, and the interlayer insulating layer 113 may each have a single-layer or multi-layer structure including the material described above.

The pixel circuit PC including the thin-film transistor TFT and the capacitor Cst may be covered by an organic insulating layer 114. An upper surface of the organic insulating layer 114 may include a substantially flat surface in the display area DA. In an embodiment, an upper surface of the organic insulating layer 114 may be uneven in the first non-display area NDA1. The organic insulating layer 114 may include an organic insulating material such as a general commercial polymer such as poly(methyl methacrylate) (PMMA) or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, a blend thereof, etc. In an embodiment, the organic insulating layer 114 may include PI.

A pixel electrode 221 may be arranged on the organic insulating layer 114. The pixel electrode 221 may include conductive oxide such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In another embodiment, the pixel electrode 221 may further include a film on/under the above-described reflective film, the film including ITO, IZO, ZnO, or $In_2O_3$. The pixel electrode 221 may be electrically connected to the thin-film transistor TFT of the pixel circuit PC through a contact hole defined in the organic insulating layer 114.

A pixel-defining layer 115 may be arranged on the organic insulating layer 114 and the pixel electrode 221. The pixel-defining layer 115 may include an opening OP exposing a portion of the pixel electrode 221 and may cover the edge of the pixel electrode 221. The opening OP of the pixel-defining layer 115 may define an emission area EA where an emission layer 222b is arranged. That is, the pixel-defining layer 115 may correspond to the periphery of the emission area EA. The pixel-defining layer 115 may be arranged between a plurality of pixel electrodes 221. The pixel-defining layer 115 may include an organic insulating material. Alternatively, the pixel-defining layer 115 may include an inorganic insulating material such as silicon nitride, silicon oxynitride, or silicon oxide. Alternatively, the pixel-defining layer 115 may include an organic insulating material and an inorganic insulating material.

An intermediate layer 222 may include the emission layer 222b. The emission layer 222b may include, for example, an organic material. The emission layer 222b may include a polymer organic material or low-molecular weight organic material that emits light of a certain color. The intermediate layer 222 may include a first functional layer 222a under the emission layer 222b and/or a second functional layer 222c on the emission layer 222b.

The first functional layer 222a may have a single-layer or multi-layer structure. For example, when the first functional layer 222a includes a polymer material, the first functional layer 222a may be a hole transport layer (HTL) having a single-layer structure and may include poly(3,4-ethylenedioxythiophene) (PEDOT) or polyaniline (PANI). When the first functional layer 222a includes a low-molecular weight material, the first functional layer 222a may include a hole injection layer (HIL) and an HTL.

The second functional layer 222c may be optional. For example, when the first functional layer 222a and the emission layer 222b include a polymer material, the second functional layer 222c may be formed. The second functional layer 222c may have a single-layer or multi-layer structure. The second functional layer 222c may include an electron transport layer (ETL) and/or an electron injection layer (EIL).

The emission layer 222b may be arranged for each pixel in the display area DA. The emission layer 222b may overlap the opening OP of the pixel-defining layer 115 and/or the pixel electrode 221. Each of the first and second functional layers 222a and 222c may be a single-body continuous layer and may be formed not only in the display area DA but also in the first non-display area NDA1.

A common electrode 223 may include a conductive material having a low work function. For example, the common electrode 223 may include a (semi)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy of these materials. Alternatively, the common electrode 223 may further include a layer, such as ITO, IZO, ZnO, or $In_2O_3$, on a (semi)transparent layer including the material described above. The common electrode 223 may be a single-body continuous layer and may cover the plurality of pixel electrodes 221 in the display area DA. The common electrode 223 may also be formed in the first non-display area NDA1.

A capping layer 230 may be arranged on the common electrode 223. The capping layer 230 may include lithium fluoride (LiF), an inorganic material and/or an organic material. In an embodiment, the capping layer 230 may be omitted.

The buffer layer 110, the first gate insulating layer 111, the second gate insulating layer 112, the interlayer insulating layer 113, the organic insulating layer 114, and the pixel-defining layer 115 shown in FIG. 9 may respectively correspond to the first insulating layer IL1, the second insulating layer IL2, the third insulating layer IL3, the fourth insulating layer IL4, and the fifth insulating layer IL5 shown in FIGS. 8B and 8C.

In the first non-display area NDA1, first wires WL1 may be arranged between the first gate insulating layer 111 and the second gate insulating layer 112, and second wires WL2 may be arranged between the second gate insulating layer 112 and the interlayer insulating layer 113. The first wires WL1 may include the first auxiliary data line DL2-C1, the first bridge AL1, and the first conductive pattern CP1 described above. The first wires WL1 may be formed of the same material and on the same layer as the gate electrode GE of the thin-film transistor TFT or the lower electrode CE1 of the capacitor Cst. The second wires WL2 may include the second auxiliary data line DL2-C2, the second bridge AL2, and the second conductive pattern CP2 described above. The second wires WL2 may be formed of the same material and on the same layer as the upper electrode CE2 of the capacitor Cst. In the first non-display area NDA1, the conductive layer MCL may be arranged between the interlayer insulating layer 113 and the organic insulating layer 114. The conductive layer MCL may be formed of the same material and on the same layer as the source electrode SE and the drain electrode DE of the thin-film transistor TFT.

The buffer layer 110, the first gate insulating layer 111, the second gate insulating layer 112, and the interlayer insulating layer 113 may have a first hole H1 corresponding to the component area CA. The first hole H1 may be formed by overlapping an opening of the buffer layer 110, an opening of the first gate insulating layer 111, an opening of the second gate insulating layer 112, and an opening of the interlayer insulating layer 113 corresponding to the component area CA. These openings may be individually formed through separate processes, or may be simultaneously formed through the same process. When these openings are formed through separate processes, an inner surface of the first hole H1 may not be smooth and may have steps such as a staircase shape. In another embodiment, no opening may be formed in the buffer layer 110, and the buffer layer 110 may have a groove. The organic insulating layer 114 may have a second hole H2 corresponding to the component area CA. The second hole H2 may overlap the first hole H1. The pixel-defining layer 115 may have a third hole H3 corresponding to the component area CA. The third hole H3 may overlap the first hole H1 and the second hole H2.

The first functional layer 222a, the second functional layer 222c, the common electrode 223, and the capping layer 230 may have a fourth hole H4 corresponding to the component area CA. That is, the first functional layer 222a, the second functional layer 222c, the common electrode 223, and the capping layer 230 may respectively have openings corresponding to the component area CA.

The description that the first to fourth holes H1 to H4 correspond to the component area CA may mean that the first to fourth holes H1 to H4 overlap the component area CA. Light transmittance in the component area CA may be improved by the first to fourth holes H1 to H4. The width W1 of the component area CA may be defined as a width of an opening having the smallest area from among the openings. The width of the opening may be a diameter of the opening.

A filler may be arranged in the first to fourth holes H1 to H4 of the component area CA. The filler may include a transparent material having a refractive index similar to that of the substrate 100 and an encapsulation member (for example, the encapsulation substrate 300a of FIGS. 2C and 2D). For example, the filler may include a filling transparent resin free of outgassing, such as an optically clear resin (OCR). By arranging the filler to correspond to the component area CA, transmittance and reflectance of light passing through the component area CA may be improved.

When the filler of the component area CA spreads to the display area DA, an area where the filler is present and an area where the filler is absent is distinguishable and visible in the display area DA. According to one or more embodiments, as the first wires WL1 and the second wires WL2 are arranged in the first non-display area NDA1, upper surfaces of the insulating layers in the first non-display area NDA1 may be uneven and thus may serve as a dam. Accordingly, the filler spreading to the display area DA may be prevented or reduced. Further, as wiring density unevenness in vertical and horizontal directions of the first non-display area NDA1 is solved by the conductive pattern CP, the filler overflowing in a certain direction may be prevented or reduced.

FIG. 10 is an enlarged plan view of region A of FIG. 7 according to another embodiment. FIG. 10 is different from FIG. 8A in which the conductive pattern CP is arranged in each column, in that the conductive pattern CP is arranged in every two columns. Hereinafter, elements different from those of FIG. 8A will be mainly described.

Referring to FIG. 10, the first portion CLa of the second auxiliary data line DL2-C2 may be bent and be close to the first auxiliary data line DL2-C1. A third conductive pattern CP3 may correspond to two columns. Similar to the first conductive pattern CP1 and the second conductive pattern CP2 shown in FIG. 8A, the third conductive pattern CP3 may have a structure in which comb teeth are arranged in parallel in the y direction and connected to each other to form the slit CPs between the comb teeth.

A size of the third conductive pattern CP3 may be greater than that of each of the first conductive pattern CP1 and the second conductive pattern CP2 of FIG. 8A. A length of comb teeth of the third conductive pattern CP3 in the x direction may be greater than that of comb teeth of the first conductive pattern CP1 and the second conductive pattern CP2 in the x direction.

The third conductive pattern CP3 may be connected to the second bridge AL2. The third conductive pattern CP3 may have a structure integrated with the second bridge AL2. The third conductive pattern CP3 may receive the driving voltage ELVDD from the second driving voltage line PL2 through the second bridge AL2. The size, the number of comb tenth and/or the number of slits between third conductive patterns CP3 may be different.

The conductive layer MCL may overlap the third conductive pattern CP3 or the auxiliary data line DL2-C. For example, as shown in FIG. 10, branches MCLb connected to the second bridge AL2 from among the branches MCLb of the conductive layer MCL may overlap the third conductive pattern CP3. Branches MCLb connected to the first bridge AL1 from among the branches MCLb of the conductive layer MCL may be bent to overlap the first auxiliary data line DL2-C1 and above the first auxiliary data line DL2-C1.

In another embodiment, the first portion CLa of the first auxiliary data line DL2-C1 may be bent and be close to the second auxiliary data line DL2-C2, and the third conductive pattern CP3 may have a structure integrated with the first bridge AL1. In this case, the branches MCLb connected to the first bridge AL1 from among the branches MCLb of the conductive layer MCL may overlap the third conductive pattern CP3, and the branches MCLb connected to the second bridge AL2 from among the branches MCLb of the conductive layer MCL may be bent to overlap the second auxiliary data line DL2-C2 and above the second auxiliary data line DL2-C2.

Figure 11:
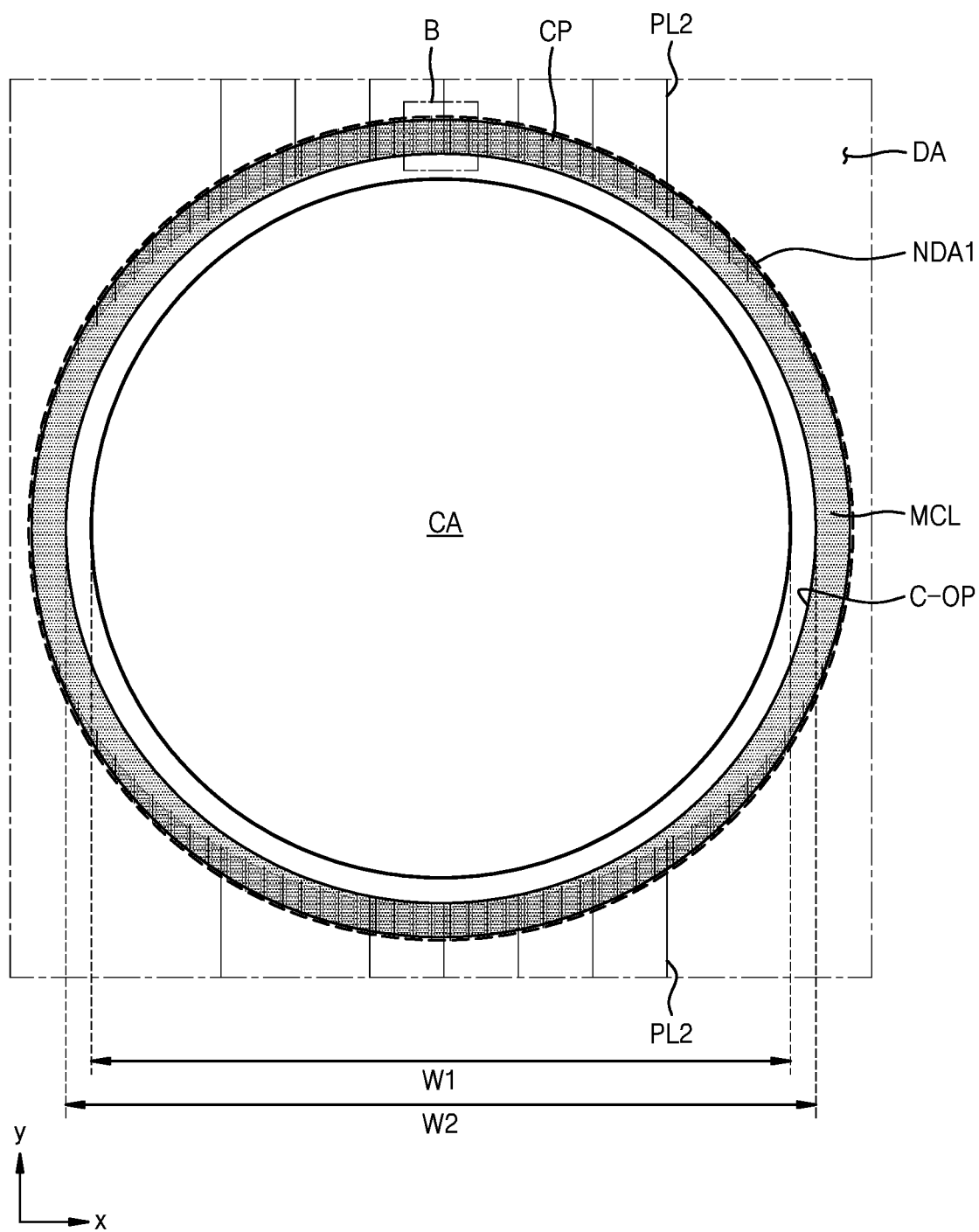
FIG. 11 is a plan view of wires around a component area according to an embodiment.
Figure 12A:
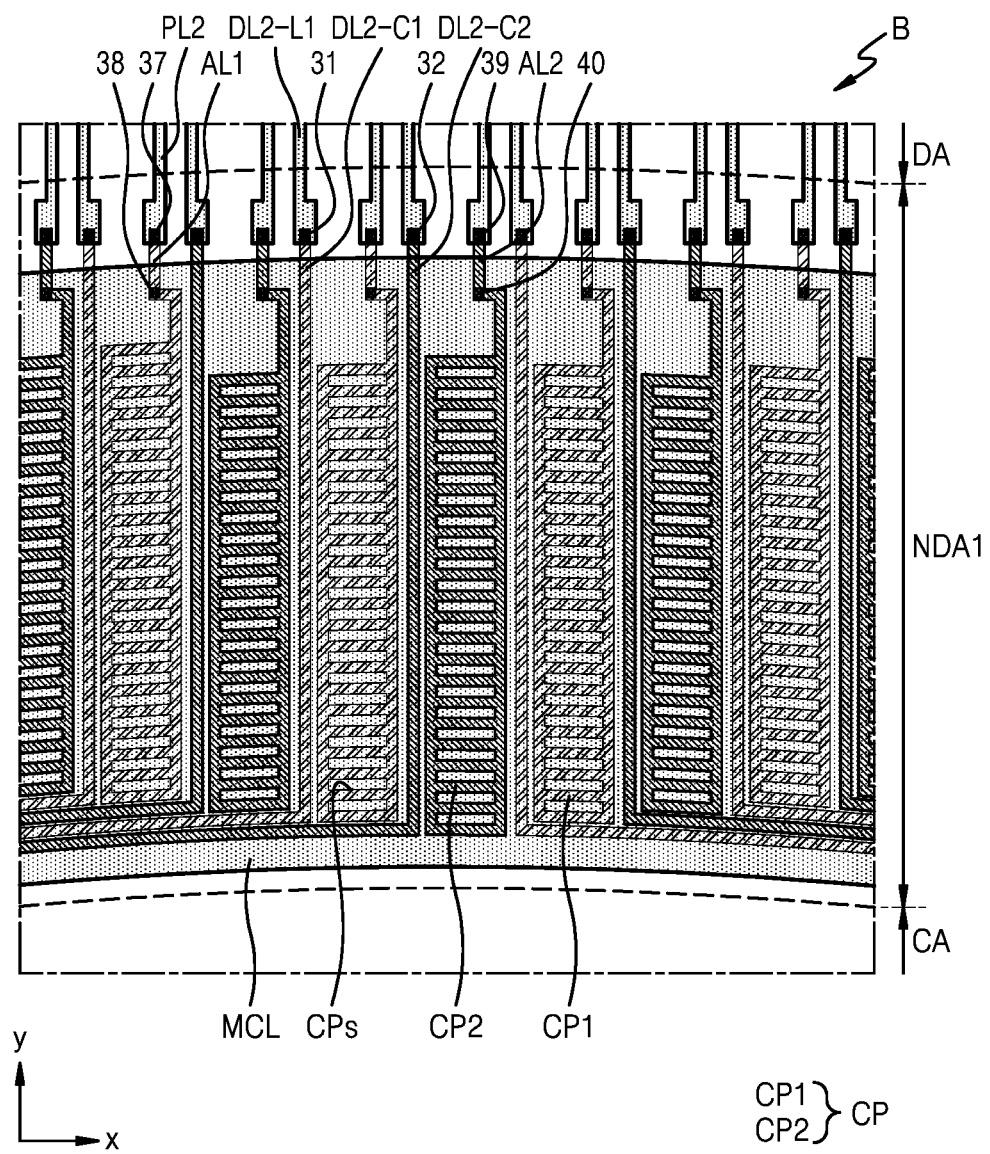
FIGS. 12A and 12B are enlarged plan views of region B of FIG. 11.
Figure 12B:
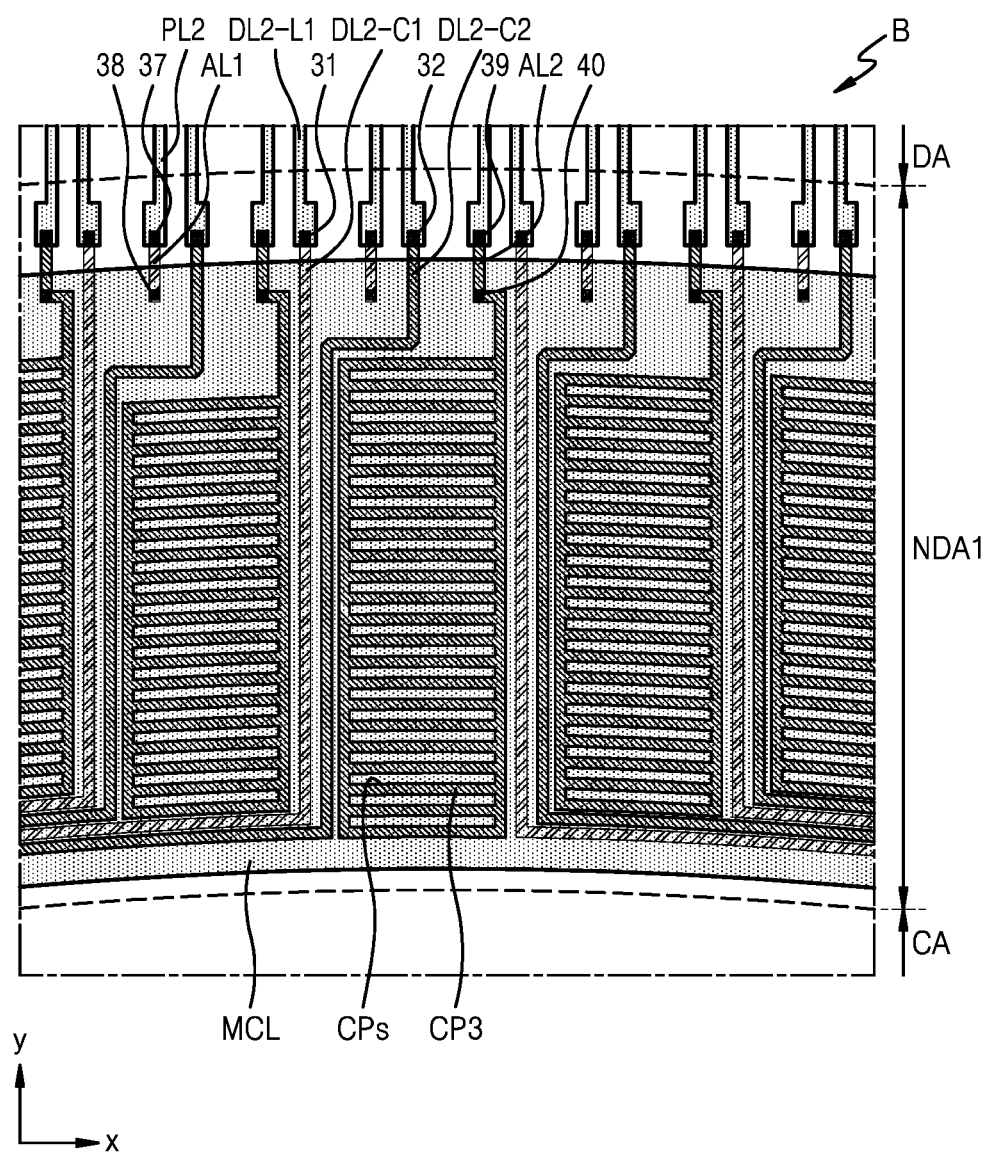

FIG. 11 is a plan view of wires around the component area CA according to an embodiment. FIGS. 12A and 12B are enlarged plan views of region B of FIG. 11. A description of elements that are the same as those in the embodiments of FIGS. 8A to 10 is omitted below.

Referring to FIG. 11, the conductive layer MCL may cover all of the first non-display area NDA1 and may have a uniform width as a whole. The conductive pattern CP may be arranged between auxiliary data lines DL2-C.

As shown in FIG. 12A, the conductive pattern CP may include the first conductive pattern CP1 and the second conductive pattern CP2 arranged in columns and alternately arranged on different layers from each other. The first conductive pattern CP1 and the second conductive pattern CP2 may be formed of the same material and on the same layer as the first bridge AL1 and the second bridge AL2, respectively, and may be connected to the first bridge AL1 and the second bridge AL2. The first conductive pattern CP1 may have a structure integrated with the first bridge AL1, and the second conductive pattern CP2 may have a structure integrated with the second bridge AL2.

Alternatively, as shown in FIG. 12B, the third conductive pattern CP3 may be repeatedly arranged in every two columns. The third conductive pattern CP3 may be connected to the second bridge AL2. The third conductive pattern CP3 may have a structure integrated with the second bridge AL2. In another embodiment, the third conductive pattern CP3 may be formed of the same material and on the same layer as the first bridge AL1, and may be connected to the first bridge AL1, or may have a structure integrated with the first bridge AL1.

As shown in FIGS. 12A and 12B, the conductive layer MCL may cover substantially all of the first auxiliary data line DL2-C1, the second auxiliary data line DL2-C2, the first bridge AL1, the second bridge AL2, the first conductive pattern CP1, the second conductive pattern CP2, and the third conductive pattern CP3 and may overlap the first auxiliary data line DL2-C1, the second auxiliary data line DL2-C2, the first bridge AL1, the second bridge AL2, the first conductive pattern CP1, the second conductive pattern CP2, and the third conductive pattern CP3.

The second driving voltage line PL2 may be connected to the conductive layer MCL. The second driving voltage line PL2 may be connected to the conductive layer MCL through the bridge AL. The first bridge AL1 may be connected to the second driving voltage line PL2 and the conductive layer MCL, respectively, through contact holes 37 and 38 of the second insulating layer IL2 and the third insulating layer IL3. The second bridge AL2 may be connected to the second driving voltage line PL2 and the conductive layer MCL, respectively, through contact holes 39 and 40 of the third insulating layer IL3. Accordingly, the conductive layer MCL may receive the driving voltage ELVDD from the second driving voltage line PL2. In FIGS. 8A and 10, the conductive layer MCL may include the branch MCLb, whereas, as shown in FIGS. 12A and 12B, the conductive layer MCL may have a plate-shaped structure including no branch.

According to one or more of the embodiments described above, conductive patterns may be arranged between auxiliary data lines arranged along the edge of the component area CA to balance vertical and horizontal wiring density in the first non-display area NDA1, and thus, a phenomenon in which a filler arranged in the component area CA spreads to the display area DA in a certain direction may be reduced or prevented. Further, the conductive pattern may be designed in a rib structure in which a plurality of slits are defined, and thus, upper surfaces of insulating layers arranged thereon may be uneven and a phenomenon in which the filler overflows to the display area DA may be reduced or prevented. Thus, according to one or more of the embodiments described above, a display device having improved reliability may be provided.

According to one or more embodiments, a display device having improved reliability may be provided. Such an effect is merely an example, and the disclosure is not limited thereto.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising a transmission area, a display area surrounding the transmission area, and a non-display area between the transmission area and the display area, the display device comprising:
    a driving voltage line extending in a first direction and arranged in the display area;
    a data line comprising a first sub-data line and a second sub-data line extending in the first direction, the first sub-data line and the second sub-data line being arranged apart from each other in the display area with the transmission area therebetween;
    an auxiliary data line connecting the first sub-data line and the second sub-data line and extending along an edge of the transmission area in the non-display area;
    a conductive layer surrounding the transmission area along an edge of the transmission area, arranged in the non-display area, and connected to the driving voltage line; and
    a conductive pattern arranged in the first non-display area and adjacent to the auxiliary data line, the conductive pattern being connected to the driving voltage line,
    wherein the conductive layer and the conductive pattern are disposed in different layers.

2. The display device of claim 1, wherein the conductive pattern includes a plurality of slits, and the plurality of slits are spaced apart from each other along a second direction different from the first direction.

3. The display device of claim 1, wherein a width of the conductive layer is different for each location in the non-display area.

4. The display device of claim 3, further comprising a bridge arranged in the non-display area and connecting the driving voltage line and the conductive layer to each other.

5. The display device of claim 4, wherein the bridge is connected to the conductive pattern.

6. The display device of claim 3, wherein a width of a first portion of the conductive layer arranged in a first area of the non-display area is different from that of a second portion of the conductive layer arranged in a second area of the non-display area.

7. The display device of claim 3, wherein the conductive layer overlaps the auxiliary data line.

8. The display device of claim 3, wherein the conductive layer covers at least a portion of the non-display area and overlaps the auxiliary data line and the conductive pattern.

9. The display device of claim 3, further comprising:
a pixel circuit arranged in the display area, connected to the driving voltage line and the data line, and comprising a thin-film transistor and a capacitor; and
a display element connected to the pixel circuit.

10. The display device of claim 9, wherein the conductive pattern is arranged on the same layer as a gate electrode of the thin-film transistor or an upper electrode of the capacitor,
wherein the conductive layer is arranged on the same layer as a source electrode and a drain electrode of the thin-film transistor.

11. The display device of claim 3, further comprising:
an insulating layer arranged on the conductive layer and comprising an uneven upper surface.

12. A display device comprising a transmission area, a display area surrounding the transmission area, and a non-display area between the transmission area and the display area, the display device comprising:
a first data line comprising a first sub-data line and a second sub-data line extending in the first direction, the first sub-data line and the second sub-data line of the first data line being arranged apart from each other in the display area with the transmission area therebetween;
a second data line comprising a first sub-data line and a second sub-data line extending in the first direction, the first sub-data line and the second sub-data line of the second data line being arranged apart from each other in the display area with the transmission area therebetween;
a first auxiliary data line connecting the first sub-data line and the second sub-data line of the first data line and extending along an edge of the transmission area in the first non-display area;
a second auxiliary data line connecting the first sub-data line and the second sub-data line of the second data line, and extending along the edge of the transmission area in the non-display area; and
a conductive pattern arranged between the first auxiliary data line and the second auxiliary data line in the non-display area and including a plurality of slits.

13. The display device of claim 12, wherein the conductive pattern is arranged on the same layer as the first auxiliary data line or the second auxiliary data line.

14. The display device of claim 12, further comprising a driving voltage line extending in the first direction in the display area,
wherein the conductive pattern is connected to the driving voltage line.

15. The display device of claim 12, further comprising:
a driving voltage line comprising a first driving voltage line and a second driving voltage line extending in the first direction, the first driving voltage line and the second driving voltage line being spaced apart from each other in the display area with the transmission area therebetween; and
a conductive layer surrounding the transmission area, arranged in the non-display area, and connected to the first driving voltage line and the second driving voltage line.

16. The display device of claim 15,
wherein the conductive layer, the first driving voltage line, and the second driving voltage line are arranged on the same layer as one another.

17. The display device of claim 15, further comprising:
a first bridge connecting the conductive layer and the first driving voltage line to each other in the non-display area; and
a second bridge connecting the conductive layer and the second driving voltage line to each other in the non-display area.

18. The display device of claim 15, wherein the conductive layer overlaps at least a portion of the first auxiliary data line and the second auxiliary data line.

19. The display device of claim 15, further comprising:
a pixel circuit arranged in the display area, connected to the first driving voltage line and the first data line, and comprising a thin-film transistor and a capacitor; and
a display element connected to the pixel circuit.

20. The display device of claim 19, wherein the conductive pattern is arranged on the same layer as a gate electrode of the thin-film transistor or an upper electrode of the capacitor,
wherein the conductive layer is arranged on the same layer as a source electrode and a drain electrode of the thin-film transistor.

21. The display device of claim 15, further comprising an insulating layer arranged on the conductive layer and comprising an uneven upper surface.

22. The display device of claim 12, further comprising:
a third data line comprising a first sub-data line and a second sub-data line extending in the first direction and spaced apart from the second data line, the first sub-data line and the second sub-data line of the third data line being arranged apart from each other in the display area with the transmission area therebetween;
a third auxiliary data line connecting the first sub-data line and the second sub-data line of the third data line and extending along the edge of the transmission area in the first non-display area; and
a second conductive pattern arranged between the second auxiliary data line and the third auxiliary data line in the non-display area and including a plurality of slits, and the first conductive pattern is arranged on the same layer as the first auxiliary data line, and the second conductive pattern is arranged on the same layer as the second auxiliary data line.

23. The display device of claim 22, further comprising:
a first driving voltage line extending in the first direction and arranged in the display area; and
a second driving voltage line extending in the first direction and spaced apart from the first driving voltage line in a second direction perpendicular to the first direction in the display area,
wherein the first conductive pattern is connected to the first driving voltage line and the second conductive pattern is connected to the second driving voltage line.

* * * * *